US012572075B2

(12) United States Patent
Takagi et al.

(10) Patent No.: US 12,572,075 B2
(45) Date of Patent: Mar. 10, 2026

(54) COMPOSITION, METHOD OF FORMING RESIST UNDERLAYER FILM, AND METHOD OF FORMING RESIST PATTERN

(71) Applicant: JSR CORPORATION, Tokyo (JP)

(72) Inventors: Yugaku Takagi, Tokyo (JP); Tsubasa Abe, Tokyo (JP); Takashi Katagiri, Tokyo (JP); Satoshi Dei, Tokyo (JP); Kazunori Takanashi, Tokyo (JP); Yuya Hayashi, Tokyo (JP)

(73) Assignee: JSR CORPORATION, Tokyo (JP)

( * ) Notice: Subject to any disclaimer, the term of this patent is extended or adjusted under 35 U.S.C. 154(b) by 821 days.

(21) Appl. No.: 17/942,332

(22) Filed: Sep. 12, 2022

(65) Prior Publication Data

US 2023/0041656 A1 Feb. 9, 2023

Related U.S. Application Data

(63) Continuation of application No. PCT/JP2021/011228, filed on Mar. 18, 2021.

(30) Foreign Application Priority Data

Mar. 19, 2020 (JP) ................................. 2020-049466

(51) Int. Cl.
*G03F 7/11* (2006.01)
*C08F 216/02* (2006.01)
(Continued)

(52) U.S. Cl.
CPC .............. *G03F 7/11* (2013.01); *C08F 216/02* (2013.01); *C08F 220/22* (2013.01); *C08G 8/12* (2013.01); *C08G 8/24* (2013.01); *H01L 21/0271* (2013.01)

(58) Field of Classification Search
CPC ........................................................ G03F 7/11
See application file for complete search history.

(56) References Cited

U.S. PATENT DOCUMENTS 9,607,849 B2 3/2017 Koumura et al.
11,300,879 B2 4/2022 Saito et al.
(Continued)

FOREIGN PATENT DOCUMENTS

JP 2004177668 A 6/2004
JP 2008257188 A 10/2008
(Continued)

OTHER PUBLICATIONS

International Search Report issued May 11, 2021 in PCT/JP2021/011228 (with English translation), 8 pages.
(Continued)

*Primary Examiner* — Amanda C. Walke
(74) *Attorney, Agent, or Firm* — Element IP, PLC

(57) ABSTRACT

A composition includes: a compound including an aromatic ring; and a first polymer including a first structural unit represented by formula (1) and a second structural unit represented by formula (2). A content of the first polymer with respect to 100 parts by mass of the compound is no less than 0.1 parts by mass and no greater than 200 parts by mass. $R^1$ represents a hydrogen atom or a substituted or unsubstituted monovalent hydrocarbon group; and $R^2$ represents a substituted or unsubstituted monovalent hydrocarbon group. $R^3$ represents a hydrogen atom or a substituted or unsubstituted monovalent hydrocarbon group; L represents a single bond or a divalent linking group; Ar represents a group obtained by removing (n+1) hydrogen atoms from a substituted or unsubstituted aromatic ring; $R^4$ represents a hydroxy group or a monovalent hydroxyalkyl group; and n is an integer of 1 to 8.

(Continued)

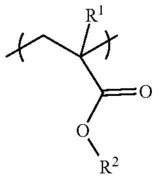

(1)

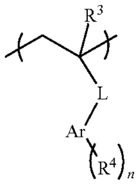

(2)

12 Claims, 1 Drawing Sheet

(51) Int. Cl.

| | |
|---|---|
| ***C08F 220/22*** | (2006.01) |
| ***C08G 8/12*** | (2006.01) |
| ***C08G 8/24*** | (2006.01) |
| ***H01L 21/027*** | (2006.01) |

(56) References Cited

U.S. PATENT DOCUMENTS

2014/0220783 A1* 8/2014 Koumura .............. H01L 21/033
524/518
2018/0046081 A1* 2/2018 Miyake ............... H01L 21/0271
2019/0212649 A1 7/2019 Saito et al.
2021/0200091 A1* 7/2021 Ho ...................... H01L 21/0274
2021/0271166 A1* 9/2021 Zi ............................ G03F 7/26
2023/0041656 A1* 2/2023 Takagi ..................... C08G 8/24

FOREIGN PATENT DOCUMENTS

JP 2017021337 A 1/2017
KR 1020080084649 A 9/2008
KR 1020110106886 A 9/2011
KR 1020140090150 A 7/2014
KR 1020170008682 A 1/2017
TW 201039067 A1 11/2010
WO WO-2010074075 A1 7/2010
WO WO-2013054702 A1 4/2013
WO WO-2018043410 A1 3/2018
WO WO-2018179704 A1 * 10/2018 ................ G03F 7/11

OTHER PUBLICATIONS

Written Opinion issued May 11, 2021 in PCT/JP2021/011228 (with English translation), 10 pages.
Combined Taiwanese Office Action and Search Report issued Jul. 30, 2024 in corresponding Taiwanese Patent Application No. 110110073 (with English translation), 9 pages.
Office Action issued Feb. 1, 2025, received Feb. 10, 2025, in corresponding Korean Patent Application No. 10-2022-7031700 (with machine English translation), 22 pages.
Office Action issued Jul. 23, 2024 in corresponding Japanese Patent Application No. 2022-508442 (with machine English translation), 10 pages.
Office Action issued Nov. 5, 2024, in corresponding Japanese Patent Application No. 2022-508442 (with machine English translation), 6 pages.

* cited by examiner

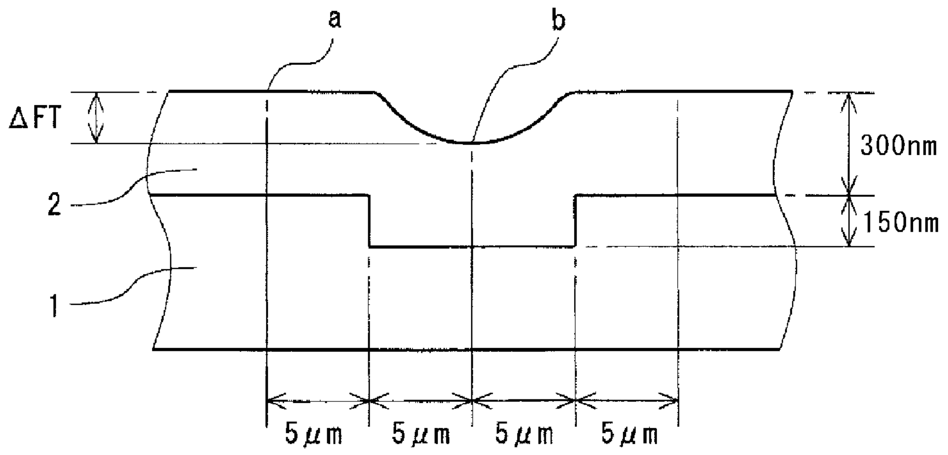
a
b
ΔFT
300nm
2
150nm
1
5μm
5μm
5μm
5μm

COMPOSITION, METHOD OF FORMING RESIST UNDERLAYER FILM, AND METHOD OF FORMING RESIST PATTERN

CROSS-REFERENCE TO RELATED APPLICATIONS

The present application is a continuation application of International Application No. PCT/JP2021/011228, filed Mar. 18, 2021, which claims priority to Japanese Patent Application No. 2020-049466 filed Mar. 19, 2020. The contents of these applications are incorporated herein by reference in their entirety.

BACKGROUND OF THE INVENTION

Field of the Invention

The present invention relates to a composition, a method of forming a resist underlayer film, and a method of forming a resist pattern.

Description of the Related Art

In manufacturing semiconductor devices, for example, a multilayer resist process has been employed in which a resist film laminated on a substrate via a resist underlayer film, e.g., an organic underlayer film or a silicon-containing film, is exposed and developed to form a resist pattern. In this process, the resist underlayer film is etched by using the resist pattern as a mask and etching is further carried out using the resultant resist underlayer film pattern as a mask, whereby a desired pattern can be formed on the substrate, thereby enabling obtaining a patterned substrate (see Japanese Unexamined Patent Application, Publication No. 2004-177668).

SUMMARY OF THE INVENTION

According to an aspect of the present invention, a composition includes: a compound including an aromatic ring; and a first polymer including a first structural unit represented by formula (1) and a second structural unit represented by formula (2). A content of the first polymer with respect to 100 parts by mass of the compound is no less than 0.1 parts by mass and no greater than 200 parts by mass.

(1)

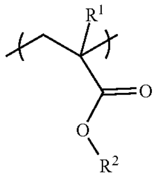

In the formula (1), $R^1$ represents a hydrogen atom or a substituted or unsubstituted monovalent hydrocarbon group having 1 to 20 carbon atoms; and $R^2$ represents a substituted or unsubstituted monovalent hydrocarbon group having 1 to 20 carbon atoms.

(2)

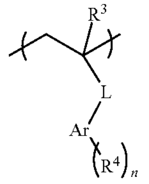

In the formula (2), $R^3$ represents a hydrogen atom or a substituted or unsubstituted monovalent hydrocarbon group having 1 to 20 carbon atoms; L represents a single bond or a divalent linking group; Ar represents a group obtained by removing (n+1) hydrogen atoms from a substituted or unsubstituted aromatic ring having 6 to 20 ring atoms; $R^4$ represents a hydroxy group or a monovalent hydroxyalkyl group having 1 to 10 carbon atoms; and n is an integer of 1 to 8, wherein in a case in which n is no less than 2, a plurality of $R^4$s are identical or different.

According to another aspect of the present invention, a method of forming a resist underlayer film includes: applying a composition for resist underlayer film formation directly or indirectly on a substrate to form the resist underlayer film. The composition for resist underlayer film formation includes: a compound including an aromatic ring; and a first polymer including a first structural unit represented by formula (1) and a second structural unit represented by formula (2). A content of the first polymer with respect to 100 parts by mass of the compound is no less than 0.1 parts by mass and no greater than 200 parts by mass.

(1)

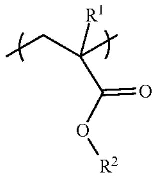

In the formula (1), $R^1$ represents a hydrogen atom or a substituted or unsubstituted monovalent hydrocarbon group having 1 to 20 carbon atoms; and $R^2$ represents a substituted or unsubstituted monovalent hydrocarbon group having 1 to 20 carbon atoms.

(2)

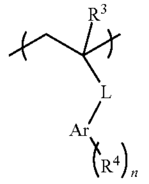

In the formula (2), $R^3$ represents a hydrogen atom or a substituted or unsubstituted monovalent hydrocarbon group having 1 to 20 carbon atoms; L represents a single bond or a divalent linking group; Ar represents a group obtained by removing (n+1) hydrogen atoms from a substituted or unsubstituted aromatic ring having 6 to 20 ring atoms; $R^4$ represents a hydroxy group or a monovalent hydroxyalkyl group having 1 to 10 carbon atoms; and n is an integer of 1 to 8, wherein in a case in which n is no less than 2, a plurality of $R^4$s are identical or different.

According to a further aspect of the present invention, a method of forming a resist pattern includes: applying a composition for resist underlayer film formation directly or indirectly on a substrate to form a resist underlayer film; applying a composition for resist film formation directly or indirectly on the resist underlayer film to form a resist film; exposing the resist film to a radioactive ray; and developing the resist film exposed. The composition for resist underlayer film formation includes: a compound including an aromatic ring; and a first polymer including a first structural unit represented by formula (1) and a second structural unit represented by formula (2). A content of the first polymer with respect to 100 parts by mass of the compound is no less than 0.1 parts by mass and no greater than 200 parts by mass.

(1)

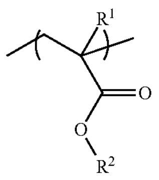

In the formula (1), $R^1$ represents a hydrogen atom or a substituted or unsubstituted monovalent hydrocarbon group having 1 to 20 carbon atoms; and $R^2$ represents a substituted or unsubstituted monovalent hydrocarbon group having 1 to 20 carbon atoms.

(2)

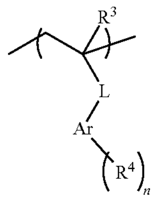

In the formula (2), $R^3$ represents a hydrogen atom or a substituted or unsubstituted monovalent hydrocarbon group having 1 to 20 carbon atoms; L represents a single bond or a divalent linking group; Ar represents a group obtained by removing (n+1) hydrogen atoms from a substituted or unsubstituted aromatic ring having 6 to 20 ring atoms; $R^4$ represents a hydroxy group or a monovalent hydroxyalkyl group having 1 to 10 carbon atoms; and n is an integer of 1 to 8, wherein in a case in which n is no less than 2, a plurality of $R^4$s are identical or different.

BRIEF DESCRIPTION OF THE DRAWING

The FIGURE is a schematic cross sectional view for showing a method of evaluating flatness.

DESCRIPTION OF EMBODIMENTS

As used herein, the words "a" and "an" and the like carry the meaning of "one or more." When an amount, concentration, or other value or parameter is given as a range, and/or its description includes a list of upper and lower values, this is to be understood as specifically disclosing all integers and fractions within the given range, and all ranges formed from any pair of any upper and lower values, regardless of whether subranges are separately disclosed. Where a range of numerical values is recited herein, unless otherwise stated, the range is intended to include the endpoints thereof, as well as all integers and fractions within the range. As an example, a stated range of 1-10 fully describes and includes the independent subrange 3.4-7.2 as does the following list of values: 1, 4, 6, 10.

A resist underlayer film and a composition of embodiments of the present invention serve as the above-described organic underlayer film and a composition used for forming the same. Organic underlayer films in a multilayer resist process are required to be superior in terms of heat resistance. Furthermore, organic underlayer films are required to have superior flatness.

One embodiment of the invention is a composition containing: a compound (hereinafter, may be also referred to as "(A) compound" or "compound (A)") having an aromatic ring; and a first polymer (hereinafter, may be also referred to as "(B) polymer" or "polymer (B)") having a first structural unit (hereinafter, may be also referred to as "structural unit (I)") represented by the following formula (1) and a second structural unit (hereinafter, may be also referred to as "structural unit (II)") represented by the following formula (2), wherein a content of the first polymer (the polymer (B)) with respect to 100 parts by mass of the compound (the compound (A)) is no less than 0.1 parts by mass and no greater than 200 parts by mass, (1)

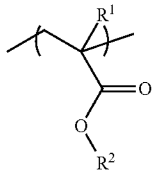

wherein, in the above formula (1), $R^1$ represents a hydrogen atom or a substituted or unsubstituted monovalent hydrocarbon group having 1 to 20 carbon atoms; and $R^2$ represents a substituted or unsubstituted monovalent hydrocarbon group having 1 to 20 carbon atoms, and (2)

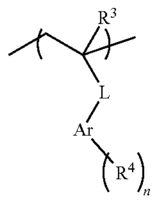

in the above formula (2), $R^3$ represents a hydrogen atom or a substituted or unsubstituted monovalent hydrocarbon group having 1 to 20 carbon atoms; L represents a single bond or a divalent linking group; Ar represents a group obtained by removing (n+1) hydrogen atoms from a substituted or unsubstituted aromatic ring having 6 to 20 ring atoms; $R^4$ represents a hydroxy group or a monovalent hydroxyalkyl group having 1 to 10 carbon atoms; and n is an integer of 1 to 8, wherein in a case in which n is no less than 2, a plurality of $R^4$s are identical or different.

An other embodiment of the present invention is a method of forming a resist underlayer film, the method including applying a composition for resist underlayer film formation directly or indirectly on a substrate, wherein the composition for resist underlayer film formation is the composition of the one embodiment of the present invention.

Still another embodiment of the invention is a method of forming a resist pattern, the method including: applying a composition for resist underlayer film formation directly or indirectly on a substrate; applying a composition for resist film formation directly or indirectly on a resist underlayer film formed by the applying of the composition for resist underlayer film formation; exposing to a radioactive ray, a resist film formed by the applying of the composition for resist film formation; and developing the resist film exposed, wherein the composition for resist underlayer film formation is the composition of the one embodiment of the present invention.

The composition and the method of forming a resist underlayer film of the embodiments of the present invention enable forming a resist underlayer film being superior in terms of heat resistance and flatness. The method of forming a resist pattern of the still another embodiment of the present invention enables forming a resist pattern having a favorable configuration. Therefore, these can be suitably used in the manufacture of semiconductor devices and the like, in which further progress of miniaturization is expected in the future.

Hereinafter, the composition, the method of forming a resist underlayer film, and the method of forming a resist pattern of embodiments of the present invention will be described in detail.

Composition

The composition of one embodiment of the present invention contains the compound (A) and the polymer (B), wherein a content of the polymer (B) with respect to 100 parts by mass of the compound (A) is no less than 0.1 parts by mass and no greater than 200 parts by mass.

The composition typically contains an organic solvent (hereinafter, may be also referred to as "(C) organic solvent" or "organic solvent (C)"). The composition preferably further contains an acid generating agent (hereinafter, may be also referred to as "(D) acid generating agent" or "acid generating agent (D)") and/or a crosslinking agent (hereinafter, may be also referred to as "(E) crosslinking agent" or "crosslinking agent (E)"). Furthermore, the composition may contain, within a range not leading to impairment of the effects of the present invention, optional component(s) other than the compound (A), the polymer (B), and the organic solvent (C) (hereinafter, may be also referred to as merely "other optional component(s)").

Due to containing the compound (A) and the polymer (B) and the content of the polymer (B) with respect to 100 parts by mass of the compound (A) being no less than 0.1 parts by mass and no greater than 200 parts by mass, the composition enables forming a resist underlayer film being superior in heat resistance and flatness. Although not necessarily clarified and without wishing to be bound by any theory, the reason for achieving the aforementioned effects by the composition due to involving such a constitution may be presumed, for example, as in the following. It is considered that due to use of the polymer (B), which has the structural unit (I) and the structural unit (II), and the compound (A) and the polymer (B) being contained in a predetermined proportion, fluidity of the composition and miscibility with the compound (A) improve, consequently enabling improving the heat resistance and flatness of the resist underlayer film formed from the composition.

Since the composition enables forming a resist underlayer film being superior in terms of heat resistance and flatness, the composition can be suitably used as a composition for forming a resist underlayer film (in other words, a composition for resist underlayer film formation). Furthermore, for the same reason, the composition can be suitably used as a composition for a multilayer resist process.

Each component contained in the composition is described below.

(A) Compound

The compound (A) has an aromatic ring. The compound (A) can be used without particular limitation as long as it has an aromatic ring. The composition may contain one, or two or more types of the compound (A).

Examples of the aromatic ring include: aromatic hydrocarbon rings such as a benzene ring, a naphthalene ring, an anthracene ring, an indene ring, a pyrene ring, a fluorenylidenebiphenyl ring, and a fluorenylidenebinaphthalene ring; aromatic heterorings such as a furan ring, a pyrrole ring, a thiophene ring, a phosphole ring, a pyrazole ring, an oxazole ring, an isoxazole ring, a thiazole ring, a pyridine ring, a pyrazine ring, a pyrimidine ring, a pyridazine ring, and a triazine ring; and the like. Of these, the aromatic hydrocarbon rings are preferred.

The compound (A) may be a polymer (hereinafter, may be also referred to as "(A) polymer" or "polymer (A)") having a structural unit including an aromatic ring, or may be a compound (in other words, an aromatic ring-containing compound) which is not a polymer. As referred to herein, the "polymer" means a compound having no less than two structural units (repeating units), and the "aromatic ring-containing compound" means, among compounds including an aromatic ring, a compound which does not fall under the polymer.

The lower limit of a molecular weight of the compound (A) is preferably no less than 300. The "molecular weight of the compound (A)" as referred to herein means a polystyrene-equivalent weight average molecular weight (hereinafter, may be also referred to as "Mw") measured by gel permeation chromatography (GPC) in accordance with the below-described conditions in the case of the compound (A) being the polymer (A), and means a molecular weight calculated from a structural formula in the case in which the compound (A) is the aromatic ring-containing compound.

The compound (A) is preferably the polymer (A). With regard to the composition, when the polymer (A) is used as the compound (A), coating characteristics of the composition can be improved.

The polymer (A) is exemplified by a polymer having an aromatic ring in a main chain thereof; a polymer not having an aromatic ring in a main chain thereof, but having an aromatic ring in a side chain thereof; and the like. The "main chain" as referred to herein means a longest chain among chains constituted from atoms in the polymer. The "side chain" as referred to herein means a chain other than the longest chain, among the chains constituted from the atoms in the polymer.

The polymer (A) may be, for example, a polycondensation compound, a compound obtained by a reaction other than polycondensation, or the like.

Examples of the polymer (A) include a novolac resin, a resol resin, a styrene resin, an acenaphthylene resin, an indene resin, an arylene resin, a triazene resin, a calixarene resin, and the like.

Novolac Resin

The novolac resin is a resin obtained by allowing a phenolic compound to react with an aldehyde compound, a divinyl compound, or the like using an acidic catalyst. A plurality of phenolic compounds may be mixed with an aldehyde compound, a divinyl compound, or the like and allowed to react.

Examples of the phenolic compound include:

- phenols such as phenol, cresol, xylenol, resorcinol, bisphenol A, p-tert-butylphenol, p-octylphenol, 9,9-bis(4-hydroxyphenyl)fluorene, 9,9-bis(3-hydroxyphenyl) fluorene, and 4,4'-(α-methylbenzylidene)bisphenol;
- naphthols such as α-naphthol, β-naphthol, 1,5-dihydroxynaphthalene, 2,7-dihydroxynaphthalene, and 9,9-bis(6-hydroxynaphthyl)fluorene;
- anthrols such as 9-anthrol;
- pyrenols such as 1-hydroxypyrene and 2-hydroxypyrene; and the like.

Examples of the aldehyde compound include:

- aldehydes such as formaldehyde, benzaldehyde, 1-naphthaldehyde, 2-naphthaldehyde, and 1-formylpyrene;
- aldehyde sources such as paraformaldehyde and trioxane; and the like.

Examples of the divinyl compound include divinylbenzene, dicyclopentadiene, tetrahydroindene, 4-vinylcyclohexene, 5-vinylnorborna-2-ene, divinylpyrene, limonene, 5-vinylnorbornadiene, and the like.

Examples of the novolac resin include: a resin having a structural unit derived from phenol and formaldehyde; a resin having a structural unit derived from cresol and formaldehyde; a resin having a structural unit derived from dihydroxynaphthalene and formaldehyde; a resin having a structural unit derived from fluorene bisphenol and formaldehyde; a resin having a structural unit derived from hydroxypyrene and naphthaldehyde; a resin having a structural unit derived from 4,4'-(α-methylbenzylidene) bisphenol and formaldehyde; a resin having a structural unit derived from a phenol compound and formylpyrene; a resin being a combination thereof; and a resin obtained by substituting a part or all of hydrogen atoms of the phenolic hydroxy groups of any of these resins with a propargyl group or the like; and the like.

Resol Resin

The resol resin is a resin obtained by allowing a phenolic compound to react with an aldehyde compound using an alkaline catalyst.

Styrene Resin

The styrene resin is a resin having a structural unit derived from a compound containing an aromatic ring and a polymerizable carbon-carbon double bond. Aside from the aforementioned structural unit, the styrene resin may have a structural unit derived from an acrylic monomer, a vinyl ether, or the like.

Examples of the styrene resin include polystyrene, polyvinylnaphthalene, polyhydroxystyrene, polyphenyl (meth) acrylate, a resin being a combination thereof, and the like.

Acenaphthylene Resin

The acenaphthylene resin is a resin having a structural unit derived from a compound that includes an acenaphthylene skeleton.

Examples of the acenaphthylene resin include a copolymer of acenaphthylene and hydroxymethylacenaphthylene, and the like.

Indene Resin

The indene resin is a resin having a structural unit derived from a compound that includes an indene skeleton.

Arylene Resin

The arylene resin is a resin having a structural unit derived from a compound that includes an arylene skeleton. The arylene skeleton is exemplified by a phenylene skeleton, a naphthylene skeleton, a biphenylene skeleton, and the like.

Examples of the arylene resin include polyarylene ether, polyarylene sulfide, polyarylene ether sulfone, polyarylene ether ketone, a resin having a structural unit that includes a biphenylene skeleton, a resin having a structural that includes a biphenylene skeleton and a structural unit derived from a compound that includes an acenaphthylene skeleton, and the like.

Triazene Resin

The triazene resin is a resin having a structural unit derived from a compound that includes a triazene skeleton.

Examples of the compound that includes the triazene skeleton include a melamine compound, a cyanuric acid compound, and the like.

In the case of the polymer (A) being the novolac resin, the resol resin, the styrene resin, the acenaphthylene resin, the indene resin, the arylene resin, or the triazene resin, the lower limit of the Mw of the polymer (A) is preferably 1,000, more preferably 2,000, still more preferably 3,000, and particularly preferably 4,000. Furthermore, the upper limit of the Mw is preferably 100,000, more preferably 60,000, still more preferably 30,000, and particularly preferably 15,000. When the Mw of the polymer (A) falls within the above range, the flatness of the resist underlayer film can be further improved.

The upper limit of Mw/Mn ("Mn" as referred to herein means a polystyrene-equivalent number average molecular weight as determined by GPC) of the polymer (A) is preferably 5, more preferably 3, and still more preferably 2. The lower limit of the Mw/Mn is typically 1, and preferably 1.2.

As referred to herein, the Mw and the Mn of the polymer are values measured by gel permeation chromatography (detector: differential refractometer) using GPC columns ("G2000 HXL"×2, "G3000 HXL"×1, and "G4000 HXL,"×1, available from Tosoh Corporation) under an analytical condition involving a flow rate of 1.0 mL/min, an elution solvent of tetrahydrofuran, and a column temperature of 40° C., with mono-dispersed polystyrene as a standard.

Calixarene Resin

The calixarene resin is a cyclic oligomer derived from a plurality of aromatic rings to which a hydroxy group bonds, through linking to be cyclic via a hydrocarbon group, or the cyclic oligomer from which a part or all of hydrogen atoms included in the hydroxy group, the aromatic ring, and the hydrocarbon group are substituted.

Examples of the calixarene resin include: a cyclic tetramer to dodecamer formed from formaldehyde and a phenol compound such as phenol or naphthol; a cyclic tetramer to dodecamer formed from a benzaldehyde compound and a phenol compound such as phenol or naphthol; a resin obtained by substituting a hydrogen atom of the phenolic hydroxy groups contained in these cyclic compounds with a propargyl group or the like; and the like.

The lower limit of a molecular weight of the calixarene resin is preferably 500, more preferably 700, and still more preferably 1,000. The upper limit of the molecular weight is preferably 5,000, more preferably 3,000, and still more preferably 1,500.

The compound (A) preferably includes a hydroxy group. Examples of the hydroxyl group include a phenolic hydroxyl group, an alcoholic hydroxyl group, and the like. When the compound (A) includes the hydroxyl group, a crosslinking reaction of the compound (A) can be promoted by the acid generating agent (D), the crosslinking agent (E), and the like, described later.

The lower limit of a proportion of the compound (A) with respect to all components other than the organic solvent (C) in the composition is preferably 20% by mass, more preferably 35% by mass, still more preferably 45% by mass, and particularly preferably 55% by mass. The upper limit of the proportion is preferably 99% by mass, more preferably 95% by mass, still more preferably 90% by mass, and particularly preferably 85% by mass.

The lower limit of a proportion of the compound (A) in the composition is preferably 0.1% by mass, more preferably 1% by mass, and still more preferably 2% by mass. The upper limit of the proportion is preferably 50% by mass, more preferably 20% by mass, and still more preferably 10% by mass.

The compound (A) may be synthesized by a well-known procedure, or a commercially available product may be used.

(B) Polymer

The polymer (B) has the structural unit (I) and the structural unit (II). The polymer (B) may have another structural unit (hereinafter, may be also referred to as merely "other structural unit") aside from the structural unit (I) and the structural unit (II). One, or two or more types of each structural unit may be included in the composition.

Structural Unit (I)

The structural unit (T) is represented by the following formula (1). The polymer (B) having the structural unit (I) enables improving the fluidity of the composition, consequently enabling improving the heat resistance and flatness of the resist underlayer film formed from the composition.

(1)

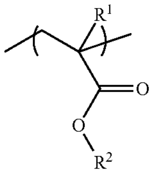

In the above formula (1), $R^1$ represents a hydrogen atom or a substituted or unsubstituted monovalent hydrocarbon group having 1 to 20 carbon atoms; and $R^2$ represents a substituted or unsubstituted monovalent hydrocarbon group having 1 to 20 carbon atoms.

The "hydrocarbon group" as referred to herein may be exemplified by a chain hydrocarbon group, an alicyclic hydrocarbon group, and an aromatic hydrocarbon group. Furthermore, the "hydrocarbon group" may be exemplified by a saturated hydrocarbon group and an unsaturated hydrocarbon group. The "chain hydrocarbon group" as referred to herein means a hydrocarbon group not including a ring structure but being constituted with only a chain structure, and may be exemplified by both a linear hydrocarbon group and a branched chain hydrocarbon group. The "alicyclic hydrocarbon group" as referred to herein means a hydrocarbon group including, as a ring structure, not an aromatic ring structure but an alicyclic structure alone, and may be exemplified by both a monocyclic alicyclic hydrocarbon group and a polycyclic alicyclic hydrocarbon group. With regard to this, it is not necessary for the alicyclic hydrocarbon group to be constituted with only an alicyclic structure; it may include a chain structure in a part thereof. The "aromatic hydrocarbon group" as referred to herein means a hydrocarbon group including an aromatic ring structure as a ring structure. With regard to this, it is not necessary for the aromatic hydrocarbon group to be constituted with only an aromatic ring structure; it may include a chain structure or an alicyclic structure in a part thereof.

The unsubstituted monovalent hydrocarbon group having 1 to 20 carbon atoms which may be represented by $R^1$ or $R^2$ may be exemplified by an unsubstituted monovalent chain hydrocarbon group having 1 to 20 carbon atoms, an unsubstituted monovalent alicyclic hydrocarbon group having 3 to 20 carbon atoms, an unsubstituted monovalent aromatic hydrocarbon group having 6 to 20 carbon atoms, and the like.

Examples of the unsubstituted monovalent chain hydrocarbon group having 1 to 20 carbon atoms include: alkyl groups such as a methyl group, an ethyl group, a propyl group, a butyl group, and a pentyl group; alkenyl groups such as an ethenyl group, a propenyl group, and a butenyl group; alkynyl groups such as an ethynyl group, a propynyl group, and a butynyl group; and the like.

Examples of the unsubstituted monovalent alicyclic hydrocarbon group having 3 to 20 carbon atoms include: cycloalkyl groups such as a cyclopentyl group and a cyclohexyl group; cycloalkenyl groups such as a cyclopropenyl group, a cyclopentenyl group, and a cyclohexenyl group; bridged cyclic hydrocarbon groups such as a norbornyl group and an adamantyl group; and the like.

Examples of the unsubstituted monovalent aromatic hydrocarbon group having 6 to 20 carbon atoms include: aryl groups such as a phenyl group and a naphthyl group, aralkyl groups such as a benzyl group, a phenethyl group, and a naphthylmethyl group; and the like.

Examples of a substituent in $R^1$ and $R^2$ include: halogen atoms such as a fluorine atom, a chlorine atom, a bromine atom, and an iodine atom; alkoxy groups such as a methoxy group, an ethoxy group, and a propoxy group; alkoxycarbonyl groups such as a methoxycarbonyl group and an ethoxycarbonyl group; alkoxycarbonyloxy groups such as a methoxycarbonyloxy group and an ethoxycarbonyloxy group; acyl groups such as a formyl group, an acetyl group, a propionyl group, and a butyryl group; a cyano group; a nitro group; a monovalent chain hydrocarbon group having 1 to 10 carbon atoms; and the like.

$R^1$ represents preferably a hydrogen atom or the substituted or unsubstituted monovalent chain hydrocarbon group having 1 to 20 carbon atoms, more preferably a hydrogen atom or the unsubstituted monovalent hydrocarbon group having 1 to 20 carbon atoms, and still more preferably a hydrogen atom or a methyl group.

$R^2$ represents preferably the substituted monovalent chain hydrocarbon group having 1 to 20 carbon atoms, more preferably a fluorine atom-substituted monovalent chain hydrocarbon group having 1 to 20 carbon atoms, and still more preferably a hexafluoroisopropyl group, a 2,2,2-trifluoroethyl group, or a 3,3,4,4,5,5,6,6-octafluorohexyl group. In this case, the flatness of the resist underlayer film formed from the composition can be further improved. As referred to herein, "fluorine atom-substituted monovalent chain hydrocarbon group having 1 to 20 carbon atoms" means a group obtained by substituting, with a fluorine atom, a part or all of hydrogen atoms contained in the chain hydrocarbon group.

The lower limit of a proportion of the structural unit (I) contained in the polymer (B) with respect to total structural units constituting the polymer (B) is preferably 10 mol %, more preferably 20 mol %, and still more preferably 30 mol %. The upper limit of the proportion is preferably 90 mol %, more preferably 80 mol %, and still more preferably 70 mol %. In the case in which the proportion of the structural unit (I) falls within the above range, the flatness of the resist underlayer film formed from the composition can be further improved.

Structural Unit (II)

The structural unit (II) is represented by the following formula (2). Due to having the structural unit (II), the polymer (B) enables improving miscibility with the compound (A), consequently enabling improving the heat resistance and flatness of the resist underlayer film formed from the composition.

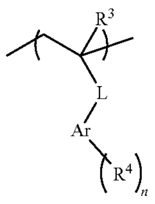

(2)

In the above formula (2), $R^3$ represents a hydrogen atom or a substituted or unsubstituted monovalent hydrocarbon group having 1 to 20 carbon atoms; L represents a single bond or a divalent linking group; Ar represents a group obtained by removing (n+1) hydrogen atoms from a substituted or unsubstituted aromatic ring having 6 to 20 ring atoms; $R^4$ represents a hydroxy group or a monovalent hydroxyalkyl group having 1 to 10 carbon atoms; and n is an integer of 1 to 8, wherein in a case in which n is no less than 2, a plurality of $R^4$s are identical or different.

Examples of the unsubstituted monovalent hydrocarbon group having 1 to 20 atoms which may be represented by $R^3$ include groups similar to those exemplified as the unsubstituted monovalent hydrocarbon group having 1 to 20 carbon atoms which may be represented by $R^1$ in the above formula (1), and the like.

Examples of the substituent in $R^3$ include groups similar to those exemplified as the substituent in $R^1$ in the above formula (1), and the like.

$R^3$ represents preferably a hydrogen atom or the substituted or unsubstituted monovalent chain hydrocarbon group having 1 to 20 carbon atoms, more preferably a hydrogen atom or the unsubstituted monovalent chain hydrocarbon group having 1 to 20 carbon atoms, and still more preferably a hydrogen atom or a methyl group.

Examples of the divalent linking group which may be represented by L include —COO—, —CO—, —O—, —CONH—, a divalent hydrocarbon group having 1 to 10 carbon atoms, and the like.

L represents preferably a single bond.

Examples of the unsubstituted aromatic ring having 6 to 20 ring atoms which may be represented by Ar include aromatic rings similar to those exemplified as the aromatic ring contained in the aforementioned compound (A), and the like. As referred to herein, the number of "ring atoms" means the number of atoms constituting the ring, and in a case of a polycyclic ring, the number of "ring atoms" means the number of atoms constituting the polycyclic ring.

Examples of the substituent in Ar include groups similar to those exemplified as the substituent in $R^1$ in the above formula (1), and the like. However, $R^4$, described later, is not considered to be a substituent in Ar.

Ar represents preferably a group obtained by removing (n+1) hydrogen atoms from an unsubstituted aromatic ring having 6 to 20 ring atoms, more preferably a group obtained by removing (n+1) hydrogen atoms from an unsubstituted aromatic hydrocarbon ring having 6 to 20 ring atoms, and still more preferably a group obtained by removing (n+1) hydrogen atoms from an unsubstituted benzene ring.

The monovalent hydroxyalkyl group having 1 to 10 carbon atoms which may be represented by $R^4$ is a group obtained by substituting, with a hydroxy group, a part or all of hydrogens atoms contained in a monovalent alkyl group having 1 to 10 carbon atoms.

$R^4$ represents preferably a monovalent hydroxyalkyl group having 1 to 10 carbon atoms, more preferably a monovalent monohydroxyalkyl group having 1 to 10 carbon atoms, and still more preferably a monohydroxymethyl group. When $R^4$ represents such a group, the flatness of the resist underlayer film formed from the composition can be further improved.

n is preferably 1 to 5, more preferably 1 to 3, still more preferably 1 or 2, and particularly preferably 1.

The lower limit of a proportion of the structural unit (II) contained in the polymer (B) with respect to total structural units constituting the polymer (B) is preferably 10 mol %, more preferably 20 mol %, and still more preferably 30 mol %. The upper limit of the proportion is preferably 90 mol %, more preferably 80 mol %, and still more preferably 70 mol %. In the case in which the proportion of the structural unit (II) falls within the above range, the flatness of the resist underlayer film formed from the composition can be further improved.

Other Structural Unit

Examples of the other structural unit include a structural unit derived from a (meth)acrylic acid ester, a structural unit derived from (meth)acrylic acid, a structural unit derived from an acenaphthylene compound, and the like.

In the case in which the polymer (B) has the other structural unit, the upper limit of a proportion of the other structural unit contained with respect to total structural units constituting the polymer (B) is preferably 20 mol %, and more preferably 5 mol %.

The lower limit of the Mw of the polymer (B) is preferably 1,000, more preferably 2,000, still more preferably 3,000, and particularly preferably 3,500. The upper limit of the Mw is preferably 100,000, more preferably 50,000, still more preferably 30,000, and particularly preferably 20,000. When the Mw of the polymer (B) falls within the above range, the heat resistance and the flatness of the resist underlayer film can be further improved.

The upper limit of a ratio Mw/Mn of the polymer (B) is preferably 5, more preferably 3, and still more preferably 2.5. The lower limit of the Mw/Mn is typically 1, and preferably 1.2.

A content of the polymer (B) in the composition with respect to 100 parts by mass of the compound (A) is no less than 0.1 parts by mass and no greater than 200 parts by mass. Due to the content of the polymer (B) falling within the above range, the heat resistance and the flatness of the resist underlayer film formed from the composition can be improved.

The lower limit of a content of the polymer (B) in the composition with respect to 100 parts by mass of the compound (A) is preferably 0.5 parts by mass, more preferably 1 part by mass, still more preferably 2 parts by mass, and particularly preferably 3 parts by mass. The upper limit of the content is preferably 100 parts by mass, more preferably 50 parts by mass, still more preferably 20 parts by mass, and particularly preferably 15 parts by mass. When the content of the polymer (B) falls within the above range, the heat resistance and the flatness of the resist underlayer film formed from the composition can be further improved.

Procedure of Synthesizing Polymer (B)

The polymer (B) can be synthesized, for example, by using a monomer that gives the structural unit (I), a monomer that gives the structural unit (II), and, as needed, monomer(s) that give(s) the other structural unit, in a usage amount that results in each predetermined proportion, and performing polymerization by a well-known procedure.

(C) Organic Solvent

The organic solvent (C) is not particularly limited as long as it is capable of dissolving or dispersing the compound (A), the polymer (B), and the optional component(s), which may be contained as needed.

The organic solvent (C) is exemplified by an alcohol solvent, a ketone solvent, an ether solvent, an ester solvent, a nitrogen-containing solvent, a hydrocarbon solvent, and the like. The composition may contain one, or two or more types of the organic solvent (C).

Examples of the alcohol solvent include monohydric alcohol solvents such as methanol, ethanol, and n-propanol; polyhydric alcohol solvents such as ethylene glycol and 1,2-propylene glycol; and the like.

Examples of the ketone solvent include chain ketone solvents such as methyl ethyl ketone and methyl isobutyl ketone; cyclic ketone solvents such as cyclohexanone; and the like.

Examples of the ether solvent include: polyhydric alcohol ether solvents, e.g., chain ether solvents such as n-butyl ether, and cyclic ether solvents such as tetrahydrofuran and 1,4-dioxane; polyhydric alcohol partial ether solvents such as diethylene glycol monomethyl ether; and the like.

Examples of the ester solvent include: carbonate solvents such as diethyl carbonate; acetic acid monoester solvents such as methyl acetate and ethyl acetate; lactone solvents such as γ-butyrolactone; polyhydric alcohol partial ether carboxylate solvents such as diethylene glycol monomethyl ether acetate and propylene glycol monomethyl ether acetate; alkylene glycol diacetate solvents such as 1,6-diacetoxyhexane; lactic acid ester solvents such as methyl lactate and ethyl lactate; and the like.

Examples of the nitrogen-containing solvent include: chain nitrogen-containing solvents such as N,N-dimethylacetamide; cyclic nitrogen-containing solvents such as N-methylpyrrolidone; and the like.

Examples of the hydrocarbon solvent include aliphatic hydrocarbon solvents such as decalin; aromatic hydrocarbon solvents such as toluene; and the like.

The organic solvent (C) is preferably the ether solvent or the ester solvent, more preferably the polyhydric alcohol partial ether solvent, the lactone solvent, the polyhydric alcohol partial ether carboxylate solvent, or the alkylene glycol diacetate solvent; and still more preferably diethylene glycol monomethyl ether, γ-butyrolactone, propylene glycol monomethyl ether acetate, or 1,6-diacetoxyhexane.

The lower limit of a proportion of the organic solvent (C) in the composition is preferably 50% by mass, more preferably 60% by mass, and still more preferably 70% by mass. The upper limit of the proportion is preferably 99.9% by mass, more preferably 99% by mass, and still more preferably 95% by mass.

(D) Acid Generating Agent

The acid generating agent (D) is a component which generates an acid by an action of a radioactive ray or heat. When the composition contains the acid generating agent (D), a crosslinking reaction of the compound (A) and the like is promoted by the acid generated, thereby enabling solvent resistance of the resist underlayer film formed from the composition to be improved.

The acid generating agent (D) is exemplified by an onium salt compound, an N-sulfonyloxyimide compound, and the like.

Examples of the onium salt compound include:

sulfonium salts such as triphenylsulfonium trifluoromethanesulfonate, triphenylsulfonium 2-(adamantan-1-ylcarbonyloxy)-1,1,3,3,3-pentafluoropropane-1-sulfonate, triphenylsulfonium norbornanesultone-2-yloxycarbonyldifluoromethanesulfonate, triphenylsulfonium piperidin-1-ylsulfonyl-1,1,2,2,3,3-hexafluoropropane-1-sulfonate, triphenylsulfonium adamantan-1-yloxycarbonyldifluoromethanesulfonate, 4-cyclohexylphenyldiphenylsulfonium camphorsulfonate, and 4-methanesulfonylphenyldiphenylsulfonium nonafluoro-n-butanesulfonate;

tetrahydrothiophenium salts such as 1-(4-n-butoxynaphthalen-1-yl)tetrahydrothiophenium trifluoromethanesulfonate, 1-(6-n-butoxynaphthalen-1-yl)tetrahydrothiophenium 2-bicyclo[2.2.1]hept-2-yl-1,1,2,2-tetrafluoroethane-1-sulfonate, and 1-(3,5-dimethyl-4-hydroxyphenyl)tetrahydrothiophenium camphorsulfonate;

iodonium salts such as diphenyliodonium trifluoromethanesulfonate, bis(4-t-butylphenyl)iodonium trifluoromethanesulfonate, bis(4-t-butylphenyl)iodonium nonafluoro-n-butanesulfonate, and 4-methoxyphenylphenyliodonium camphorsulfonate; and the like.

Examples of the N-sulfonyloxyimide compound include N-(trifluoromethylsulfonyloxy)bicyclo[2.2.1]hept-5-ene-2,3-dicarboxyimide, N-(camphorsulfonyloxy)bicyclo[2.2,]hept-5-ene-2,3-dicarboxyimide, and the like.

The acid generating agent (D) is preferably the onium salt compound, more preferably the iodonium salt, and still more preferably bis(4-t-butylphenyl)iodonium nonafluoro-n-butanesulfonate.

In the case in which the composition contains the acid generating agent (D), the lower limit of a content of the acid generating agent (D) with respect to 100 parts by mass of the compound (A) is preferably 0.1 parts by mass, more preferably 0.5 parts by mass, still more preferably 1 part by mass, and particularly preferably 2 parts by mass. The upper limit of the content is preferably 30 parts by mass, more preferably 20 parts by mass, still more preferably 10 parts by mass, and particularly preferably 8 parts by mass. When the content of the acid generating agent (D) falls within the above range, solvent resistance of the resist underlayer film formed from the composition can be further improved.

(F) Crosslinking Agent

The crosslinking agent (E) is a component capable of forming a crosslinking bond between components such as the compound (A) in the composition, or capable of forming a cross-linked structure per se, by an action of heat or an acid. When the composition contains the crosslinking agent (E), solvent resistance of the resist underlayer film formed from the composition can be improved.

The crosslinking agent (E) is exemplified by a polyfunctional (meth)acrylate compound, an epoxy compound, a hydroxymethyl group-substituted phenol compound, an alkoxyalkyl group-containing phenol compound, a compound having an alkoxyalkylated amino group, and the like.

Examples of the polyfunctional (meth)acrylate compound include trimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, glycerin tri(meth)acrylate, tris(2-hydroxyethyl)isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentyl glycol di(meth) acrylate, diethylene glycol di(meth)acrylate, triethylene glycol di(meth)acrylate, dipropylene glycol di(meth)acrylate, bis(2-hydroxyethyl)isocyanurate di(meth)acrylate, and the like.

Examples of the epoxy compound include novolac epoxy resins, bisphenol epoxy resins, alicyclic epoxy resins, aliphatic epoxy resins, and the like.

Examples of the hydroxymethyl group-substituted phenol compound include 2-hydroxymethyl-4,6-dimethylphenol, 1,3,5-trihydroxymethylbenzene, 3,5-dihydroxymethyl-4-methoxytoluene[2,6-bis(hydroxymethyl)-p-cresol], and the like.

An exemplary alkoxyalkyl group-containing phenol compound is a methoxymethyl group-containing phenol compound, an ethoxymethyl group-containing phenol compound, or the like.

The compound having an alkoxyalkylated amino group is exemplified by nitrogen-containing compounds having a plurality of active methylol groups in a molecule thereof wherein the hydrogen atom of the hydroxy group of at least one of the methylol groups is substituted with an alkyl group such as a methyl group or a butyl group, and the like; examples thereof include (poly)methylolated melamines, (poly)methylolated glycolurils, (poly)methylolated benzoguanamines, (poly)methylolated ureas, and the like. It is to be noted that a mixture constituted with a plurality of substituted compounds may be used as the compound having an alkoxyalkylated amino group, and the compound having an alkoxyalkylated amino group may contain an oligomer component formed through partial self-condensation thereof.

The crosslinking agent (E) is preferably the compound having an alkoxyalkylated amino group, more preferably (poly)methylolated glycolurils, and still more preferably 1,3,4,6-tetrakis(methoxymethyl)glycoluril.

In the case in which the composition contains the crosslinking agent (E), the lower limit of a content of the crosslinking agent (E) with respect to 100 parts by mass of the compound (A) is preferably 0.1 parts by mass, more preferably 1 part by mass, still more preferably 3 parts by mass, and particularly preferably 5 parts by mass. The upper limit of the content is preferably 50 parts by mass, more preferably 30 parts by mass, still more preferably 20 parts by mass, and particularly preferably 15 parts by mass. When the content of the crosslinking agent (E) falls within the above range, solvent resistance of the resist underlayer film formed from the composition can be further improved.

Other Optional Component(s)

The other optional component(s) is/are exemplified by a surfactant, an adhesion aid, and the like.

Procedure of Preparing Composition

The composition may be prepared, for example, by: mixing the compound (A), the polymer (B), and the organic solvent (C), as well as the other optional component(s), which are added as needed, in a certain ratio; and preferably filtering a thus resulting mixed solution through a filter having a pore size of no greater than 0.2 μm.

Method of Forming Resist Underlayer Film

The method of forming a resist underlayer film of the other embodiment of the present invention includes a step (hereinafter, may be also referred to as "applying step") of applying a composition for resist underlayer film formation directly or indirectly on a substrate. In the method of forming a resist underlayer film, the composition of the one embodiment of the present invention is employed as the composition for resist underlayer film formation. Thus, the method of forming a resist underlayer film enables forming a resist underlayer film being superior in terms of heat resistance and flatness.

Applying Step

In this step, the composition for resist underlayer film formation is applied directly or indirectly on the substrate. By this step, a coating film of the composition for resist underlayer film formation is formed directly or indirectly on the substrate. Through, e.g., volatilization of the organic solvent (C) from the coating film, the resist underlayer film is formed. This resist underlayer film is an organic underlayer film.

Examples of the substrate include a silicon wafer, a wafer coated with aluminum, and the like. The substrate may be a substrate having no pattern formed thereon, or may be a substrate having a pattern formed thereon.

A procedure of applying the composition for resist underlayer film formation is not particularly limited, and for example, an appropriate procedure such as spin coating, cast coating, or roll coating may be employed to enable forming of the coating film.

In this step, the coating film may be heated to promote formation of the resist underlayer film. Examples of an atmosphere in which the heating of the coating film is conducted include an ambient air, a nitrogen atmosphere, and the like. The lower limit of a heating temperature is preferably 100° C., and more preferably 200° C. The upper limit of the beating temperature is preferably 600° C., and more preferably 500° C. The lower limit of a heating time period is preferably 10 sec, and more preferably 30 sec. The upper limit of the heating time period is preferably 300 see, and more preferably 180 sec.

The lower limit of an average thickness of the resist underlayer film to be formed is preferably 30 nm, more preferably 50 nm, and still more preferably 100 nm. The upper limit of the average thickness is preferably 3,000 nm, more preferably 2,000 nm, and still more preferably 500 nm. As referred to herein, the "average thickness" means a value obtained by measurement using a spectroscopic ellipsometer ("M2000D," available from J.A. Woollam Co.).

Method of Forming Resist Pattern

The method of forming a resist pattern of the still another embodiment of the present invention includes: a step (hereinafter, may be also referred to as "resist-underlayer-film-forming-composition-applying step") of applying a composition for resist underlayer film formation directly or indirectly on a substrate; a step (hereinafter, may be also referred to as "resist-film-forming-composition-applying step") of applying a composition for resist film formation directly or indirectly on a resist underlayer film formed by the resist-underlayer-film-forming-composition-applying step; a step (hereinafter, may be also referred to as "exposing step") of exposing a resist film formed by the resist-film-forming-composition-applying step to a radioactive ray; and a step (hereinafter, may be also referred to as "developing step") of developing the resist film exposed. In the method of forming a resist pattern, the composition of the one embodiment of the present invention, described above, is used as the composition for resist underlayer film formation. Thus, the method of forming a resist pattern enables forming a resist pattern having a favorable configuration.

The method of forming a resist pattern may further include, as needed, before the resist-film-forming-composition-applying step, a step (hereinafter, may be also referred to as "silicon-containing film-forming step") of forming a silicon-containing film directly or indirectly on the resist underlayer film formed by the resist-underlayer-film-forming-composition-applying step.

Hereinafter, each step included in the method of forming a resist pattern will be described.

Resist-Underlayer-Film-Forming-Composition-Applying Step

In this step, the composition for resist underlayer film formation is applied directly or indirectly on the substrate. This step is similar to the applying step in the method of forming a resist underlayer film, described above.

Silicon-Containing Film-Forming Step

In this step, before the resist-film-forming-composition-applying step, described later, the silicon-containing film is formed directly or indirectly on the resist underlayer film formed by the resist-underlayer-film-forming-composition-applying step. By this step, a silicon-containing film is formed.

The silicon-containing film may be formed by, for example, applying a composition for silicon-containing film formation, a chemical vapor deposition (CVD) procedure, atomic layer deposition (ALD), or the like. A procedure of forming the silicon-coating film by applying the composition for silicon-containing film formation is exemplified by applying the composition for silicon-containing film formation directly or indirectly on the resist underlayer film to form a coating film; and hardening the coating film by subjecting the coating film to an exposure and/or heating. As a commercially available product of the composition for silicon-containing film formation, for example, "NEC SOG01" "NEC SOG04", or "NEC SOG080" (all available from JSR Corporation), or the like may be used. A silicon oxide film, a silicon nitride film, a silicon oxynitride film, or an amorphous silicon film can be formed by the chemical vapor deposition (CVD) procedure or the atom layer deposition (ALD).

Examples of the radioactive ray to be used in the exposure include radioactive rays similar to those used in the exposing step, described later, and the like.

The lower limit of a heating temperature for the coating film is preferably 90° C., more preferably 150° C., and still more preferably 180° C. The upper limit of the heating temperature is preferably 550° C., more preferably 450° C., and still more preferably 300° C.

The lower limit of an average thickness of the silicon-containing film to be formed is preferably 1 nm, more preferably 10 nm, and still more preferably 30 nm. The upper limit of the average thickness is preferably 20,000 nm, more preferably 1,000 nm, and still more preferably 100 nm.

Resist-Film-Forming-Composition-Applying Step in this step, the composition for resist film formation is applied directly or indirectly on the resist underlayer film formed by the resist-underlayer-film-forming-composition-applying step. In the case in which the method of forming a resist pattern includes the silicon-containing film-forming step, the composition for resist film formation is applied on the silicon-containing film formed by the silicon-containing film-forming step. By this step, a resist film is formed.

In this step, specifically, the resist film is formed by: applying the composition for resist film formation to form a coating film such that a resultant resist film has a predetermined thickness, and subsequently subjecting the coating film to heating to evaporate away the solvent contained therein.

Examples of the composition for resist film formation include a chemically amplified positive or negative resist composition that contains a radiation-sensitive acid generating agent; a positive resist composition containing an alkali-soluble resin and a quinone diazide-based photosensitizing agent; a negative resist composition containing an alkali-soluble resin and a crosslinking agent; and the like.

The lower limit of a proportion of all components other than the solvent in the composition for resist film formation is preferably 0.3% by mass, and more preferably 1% by mass. The upper limit of the proportion is preferably 50% by mass, and more preferably 30% by mass. Moreover, the composition for resist film formation is employed for forming the resist film, typically, after filtering through a filter having a pore size of no greater than 0.2 μm, for example. It is to be noted that in this step, a commercially available resist composition may be used directly.

A procedure for applying the composition for resist film formation is exemplified by a spin-coating procedure and the like. A temperature when heating the coating film may be appropriately adjusted depending on the type of the composition for resist film formation used. The lower limit of the temperature of the heating is preferably 30° C., and more preferably 50° C. The upper limit of the temperature is preferably 200° C., and more preferably 150° C. The lower limit of a time period of the heating is preferably 10 sec, and more preferably 30 sec. The upper limit of the time period is preferably 600 sec, and more preferably 300 sec.

Exposing Step

In this step, the resist film formed by the resist-film-forming-composition-applying step is exposed to a radioactive ray.

The radioactive ray for use in the exposure may be appropriately selected from: electromagnetic waves such as visible rays, ultraviolet rays, far ultraviolet rays, X-rays, and γ-rays; and particle rays such as electron beams, molecular beams, and ion beams in accordance with the type of the radiation-sensitive acid generating agent to be used in the composition for resist film formation. Among these, far ultraviolet rays are preferred; and a KrF excimer laser beam (wavelength: 248 nm), an ArF excimer laser beam (wavelength: 193 nm), an extreme ultraviolet ray (EUV; wavelength: 13.5 nm, etc.), or an electron beam is more preferred.

Post-exposure heating may be carried out after the exposure for the purpose of improving resolution, pattern profile, developability, and the like. A temperature of the post-exposure heating may be appropriately adjusted depending on the type of the composition for resist pattern formation used. The lower limit of the temperature of the post-exposure heating is preferably 50° C., and more preferably 70° C. The upper limit of the temperature is preferably 200° C., and more preferably 150° C. The lower limit of a time period of the post-exposure heating is preferably 10 sec, and more preferably 30 sec. The upper limit of the time period is preferably 600 sec, and more preferably 300 sec.

Developing Step

In this step, the resist film exposed is developed. The development may be either a development with an alkali or a development with an organic solvent. In the case of the development with an alkali, examples of the developer solution include basic aqueous solutions of sodium hydroxide, potassium hydroxide, sodium carbonate, sodium silicate, sodium metasilicate, ammonia, ethylamine, n-propylamine, diethylanine, di-n-propylamine, triethylamine, methyldiethylamine, dimethylethanolamine, triethanolamine, tetramethyl ammonium hydroxide (TMAH), tetraethyl ammonium hydroxide, pyrrole, piperidine, choline, 1,8-diazabicyclo[5.4.0]-7-undecene, 1,5-diazabicyclo[4.3.0]-5-nonene, or the like. To the basic aqueous solution, a water-soluble organic solvent, e.g., alcohols such as methanol and ethanol, a surfactant, etc., may be added each in an appropriate amount. Alternatively, in the case of the development with an organic solvent, examples of the developer solution include various organic solvents exemplified as the organic solvent (C) contained in the composition of the one embodiment of the present invention, described above, and the like.

A predetermined resist pattern is formed by the development with the developer solution, followed by washing and drying.

Conducting etching using as a mask, the resist pattern formed by the resist pattern-forming method enables forming a pattern on the substrate.

The etching may be conducted once or multiple times. In other words, the etching may be conducted sequentially with patterns obtained by the etching as masks. In light of obtaining a pattern having a more favorable configuration, the etching is preferably conducted multiple times. In the case in which the etching is conducted multiple times, for example, the silicon-containing film, the resist underlayer film, and the substrate are subjected to the etching sequentially in this order. An etching procedure may be exemplified by dry etching, wet etching, and the like. In light of the configuration of the substrate pattern to be formed being more favorable, the dry etching is preferred. In the dry etching, for example, gas plasma such as oxygen plasma, or the like may be used.

The dry etching may be conducted by using, for example, a well-known dry etching apparatus. An etching gas to be used for the dry etching may be appropriately selected depending on the mask pattern, element composition of the film to be etched, and the like. Examples of the etching gas include: fluorine-based gases such as $CHF_3$, $CF_4$, $C_2F_6$, $C_3F_8$, and $SF_6$; chlorine-based gases such as $Cl_2$ and $BCl_3$; oxygen-based gases such as $O_2$, $O_3$, and $H_2O$; reductive gases such as $H_2$, $NH_3$, CO, $CO_2$, $CH_4$, $C_2H_2$, $C_2H_4$, $C_2H_6$, $C_3H_4$, $C_3H_6$, $C_3H_8$, HF, HI, HBr, HCl, NO, $NH_3$, and $BCl_3$; inert gases such as He, $N_2$, and Ar; and the like. These gases may be used as a mixture. In the case of etching the substrate using the resist underlayer film pattern as a mask, the fluorine-based gas is typically used.

EXAMPLES

Hereinafter, the present invention will be explained in more detail by way of Examples, but the present invention is not in any way limited to these Examples. Various physical property values in the Examples were measured by the following methods.

Weight Average Molecular Weight (Mw)

The Mw of the polymer was determined by gel permeation chromatography (detector: differential refractometer) using GPC columns ("G2000 HXL"×2, "G3000 HXL"×1, and "G4000 HXL"×1; available from Tosoh Corporation), under analytical conditions involving a flow rate of 1.0 mL/min, an elution solvent of tetrahydrofuran, and a column temperature of 40° C., with mono-dispersed polystyrene as a standard.

Average Thickness of Film

The average thickness of the film was measured by using a spectroscopic ellipsometer ("M2000D," available from J. A. WOOLLAM Co.).

Synthesis of Compound (A)

As the compound (A), compounds or polymers (hereinafter, may be also referred to as "compounds or polymers (A-1) to (A-8) and (A-11) to (A-21)") represented by the following formulae (A-1) to (A-8) and (A-11) to (A-21) were synthesized in accordance with the following procedure. With regard to a compound (compound (A-9)) represented by the following formula (A-9), an existing product was used. Polymer (A-10) has a structural unit derived from the compound (A-9).

(A-1)

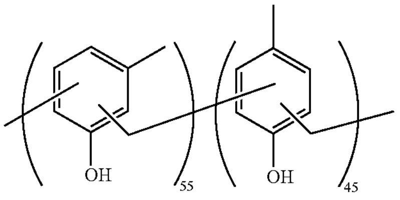

(A-2)

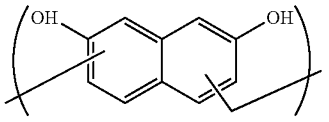

(A-3)

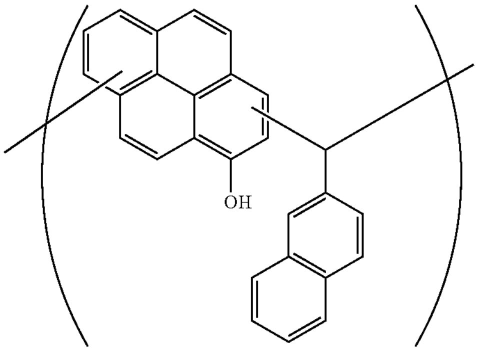

-continued
(A-4)
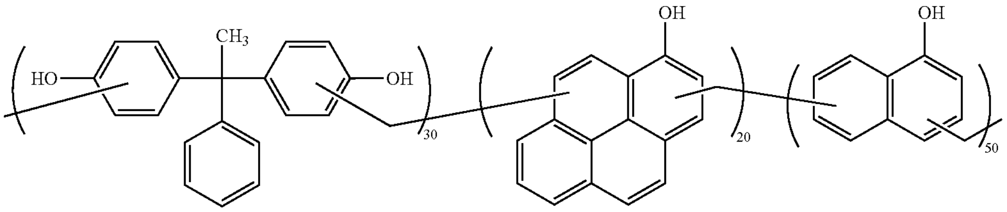
(A-5)
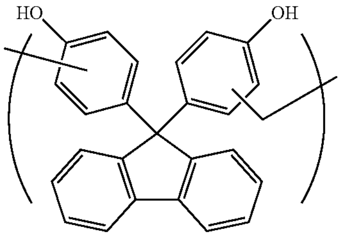
(A-6)
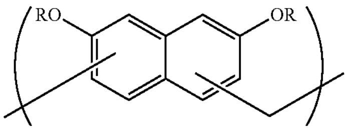
R= H or
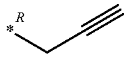
(A-7)
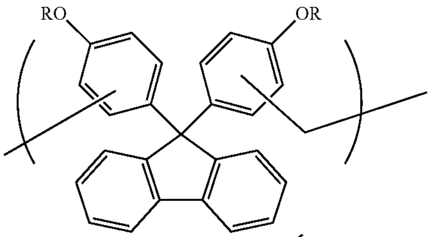
R= H or
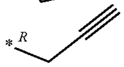
(A-8)
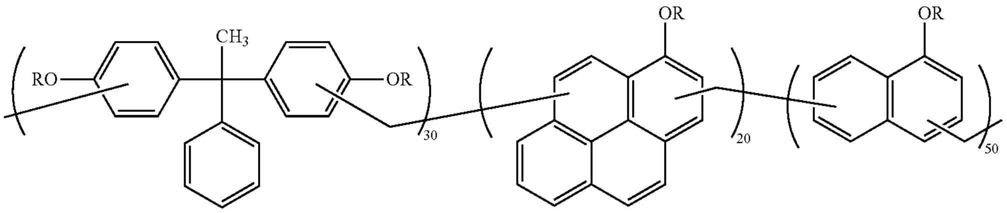
R= H or
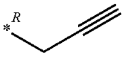
(A-9)
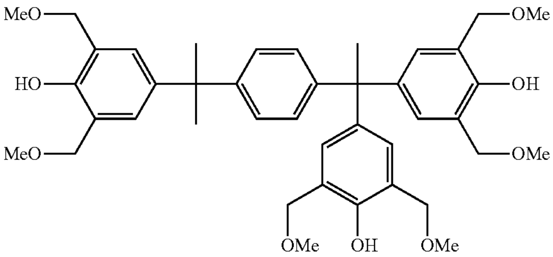
(A-11)
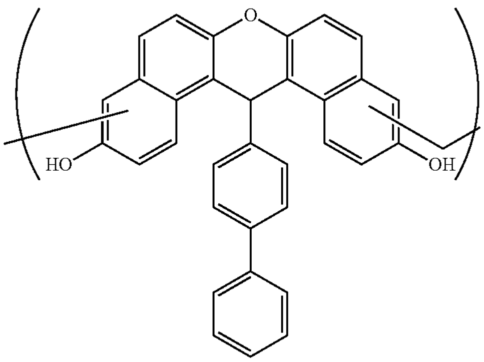

-continued
(A-12)
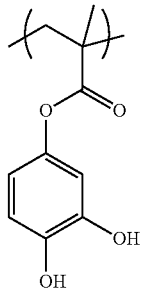
(A-13)
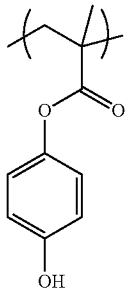
(A-14)
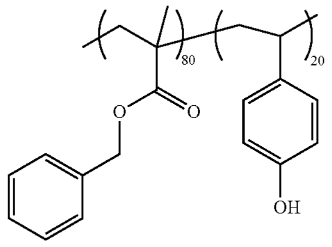
(A-15)
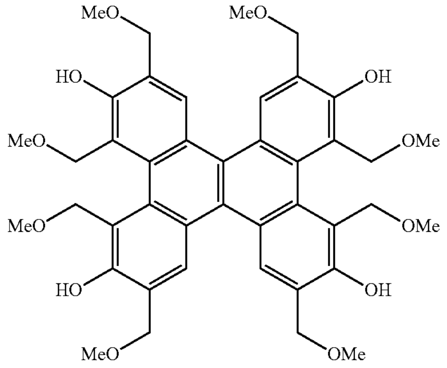
(A-16)
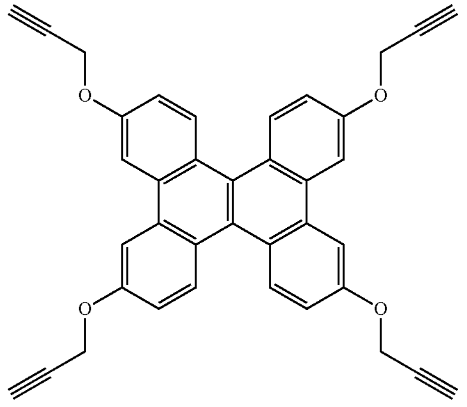
(A-17)
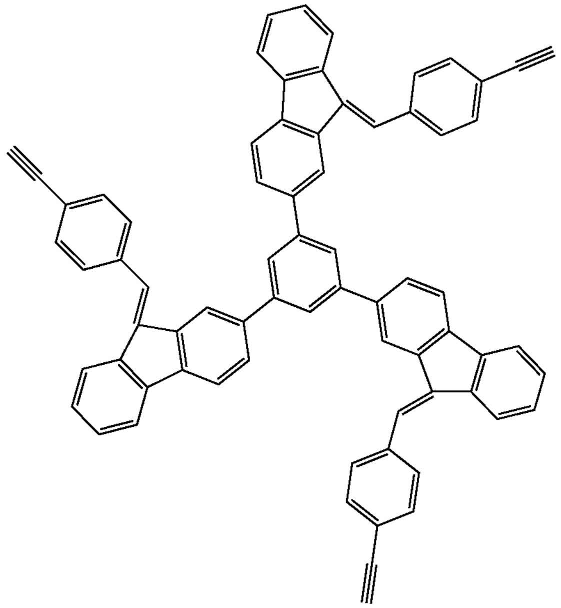
(A-18)
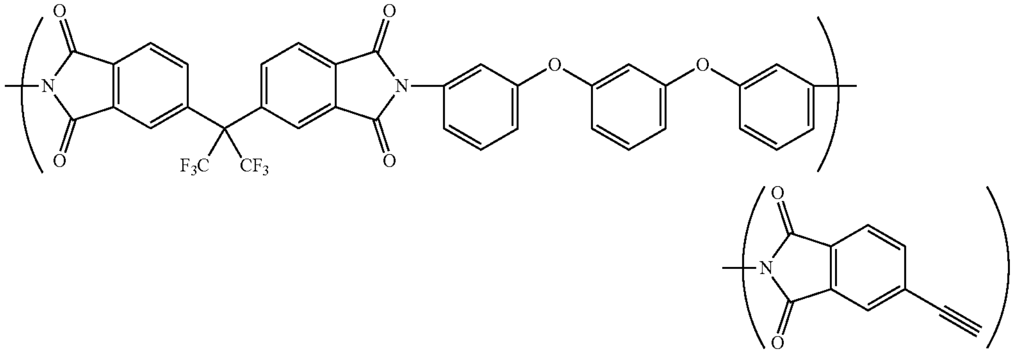

-continued (A-19)

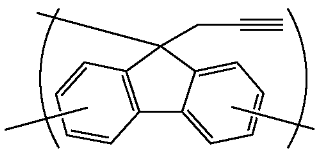

(A-20)

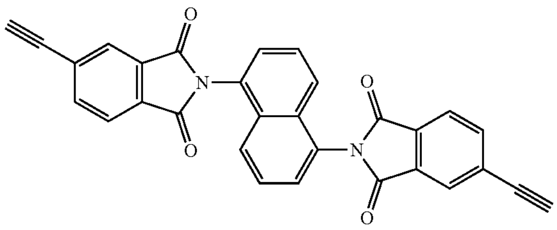

(A-21)

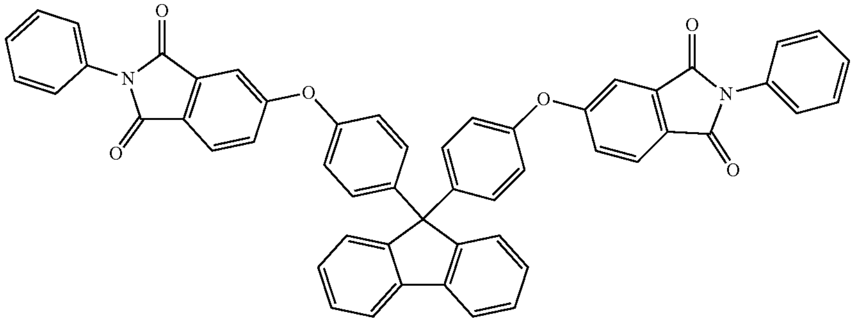

In the above formulae (A-1), (A-4), (A-8), and (A-14), numbers appended to each structural unit indicate a proportion (mol %) of that structural unit. In the above formulae (A-6), (A-7), and (A-8), $*^R$ indicates a site to which an oxygen atom bonds.

Synthesis Example 1-1: Synthesis of Polymer (A-1)

Into a reaction vessel, 70 g of m-cresol, 57.27 g of p-cresol, 95.52 g of a 37% by mass aqueous formaldehyde solution, and 381.82 g of methyl isobutyl ketone were charged and dissolution was allowed in a nitrogen atmosphere. After a resulting solution was heated to 40° C., 2.03 g of p-toluenesulfonic acid was added thereto and a reaction was allowed at 85° C. for 4 hrs. The reaction liquid was cooled to 30° C. or below, and this reaction liquid was charged into a mixed solution of methanol/water (50/50 (mass ratio)) to permit reprecipitation. The precipitate was collected on a filter paper and then dried to give the polymer (A-1). The Mw of the polymer (A-1) was 5,000.

Synthesis Example 1-2: Synthesis of Polymer (A-2)

Into a reaction vessel, 150 g of 2,7-dihydroxynaphthalene, 76.01 g of a 37% by mass aqueous formaldehyde solution, and 450 g of methyl isobutyl ketone were charged and dissolution was allowed in a nitrogen atmosphere. After a resulting solution was heated to 40° C., 1.61 g of p-toluenesulfonic acid was added thereto and a reaction was allowed at 80° C. for 7 hrs. The reaction liquid was cooled to 30° C. or below, and this reaction liquid was charged into a mixed solution of methanol/water (50/50 (mass ratio)) to permit reprecipitation. The precipitate was collected on a filter paper and then dried to give the polymer (A-2). The Mw of the polymer (A-2) was 3,000.

Synthesis Example 1-3: Synthesis of Polymer (A-3)

Into a reaction vessel, 20 g of 1-hydroxypyrene, 7.16 g of 2-naphthaldehyde, and 82 g of propylene glycol monomethyl ether were charged and dissolution was allowed at room temperature in a nitrogen atmosphere. 8.81 g of methanesulfonate was added to a resulting solution, and the mixture was stirred at 120° C. for 12 hrs to conduct polymerization. After completion of the polymerization, the polymerization reaction liquid was charged into a large quantity of a mixed solution of methanol/water (80/20 (% by volume)), and collection of a thus obtained precipitate by filtering gave the polymer (A-3). The Mw of the polymer (A-3) was 1,100.

Synthesis Example 1-4: Synthesis of Polymer (A-4)

Into a reaction vessel, 15.2 g of 4,4'-(α-methylbenzylidene)bisphenol, 7.63 g of 1-hydroxypyrene, 12.6 g of 1-naphthol, and 4.52 g of paraformaldehyde were charged in a nitrogen atmosphere. Next, 60 g of propylene glycol monomethyl ether acetate was added to a resulting mixture and dissolution was allowed, followed by adding 0.220 g of p-toluenesulfonic acid monohydrate, and the mixture was stirred at 95° C. for 6 hrs to conduct polymerization. After completion of the polymerization, the polymerization reaction liquid was charged into a large quantity of a mixed solution of methanol/water (70/30 (mass ratio)), and collection of a thus obtained precipitate by filtering gave the polymer (A-4). The Mw of the polymer (A-4) was 3,363.

Synthesis Example 1-5: Synthesis of Polymer (A-5)

A polymer (A-5) was obtained in a similar manner to Synthesis Example 1-4, except that the 15.2 g of 4,4'-(α-methylbenzylidene)bisphenol, 7.63 g of 1-hydroxypyrene, 12.6 g of 1-naphthol, and 4.52 g of paraformaldehyde in Synthesis Example 1-4 were replaced with 37.9 g of bisphenolfluorene and 2.86 g of paraformaldehyde. The Mw of the polymer (A-5) was 4,500.

Synthesis Example 1-6: Synthesis of Polymer (A-6)

Into a reaction vessel, 20 g of the polymer (A-2) synthesized in Synthesis Example 1-2, 80 g of N,N-dimethylacetanide, and 22 g of potassium carbonate were charged in a nitrogen atmosphere. Next, a resulting solution was heated to 80° C., 19 g of propargyl bromide was added thereto, and a reaction was allowed for 6 hrs with stirring. Subsequently, to the reaction solution were added 40 g of methyl isobutyl ketone and 80 g of water and a liquid separation operation was conducted. Thereafter, an organic phase thus obtained was charged into a large quantity of methanol and a thus obtained precipitate was collected by filtering to give the polymer (A-6). The Mw of the polymer (A-6) was 3,200.

Synthesis Example 1-7: Synthesis of Polymer (A-7)

Into a reaction vessel, 20 g of the polymer (A-5) synthesized in Synthesis Example 1-5, 80 g of N,N-dimethylacetamide, and 22 g of potassium carbonate were charged in a nitrogen atmosphere. Next, a resulting solution was heated to 80° C., 19 g of propargyl bromide was added thereto, and a reaction was allowed for 6 hrs with stirring. Thereafter, to the reaction solution were added 40 g of methyl isobutyl ketone and 80 g of water and a liquid separation operation was conducted, followed by charging an organic phase thus obtained into a large quantity of methanol and collecting a thus obtained precipitate by filtering to give the polymer (A-7). The Mw of the polymer (A-7) was 4,800.

Synthesis Example 1-8: Synthesis of Polymer (A-8)

Into a reaction vessel, 20 g of the polymer (A-4) synthesized in Synthesis Example 1-4 and 18.9 g of potassium carbonate were charged in a nitrogen atmosphere. Next, a resulting solution was heated to 80° C., 35.3 g of propargyl bromide was added thereto, and a reaction was allowed for 6 hrs with stirring. Thereafter, to the reaction solution were added 40 g of methyl isobutyl ketone and 80 g of water, and a liquid separation operation was conducted. Thereafter an organic phase thus obtained was charged into a large quantity of methanol and a thus obtained precipitate was collected by filtering to give the polymer (A-8). The Mw of the polymer (A-8) was 3,820.

Synthesis Example 1-9: Synthesis of Polymer (A-10)

50.0 g of the compound (A-9) was dissolved in 200 g of methyl isobutyl ketone. A thus obtained solution was heated to 40° C., and then 0.69 g of p-toluenesulfonate was added thereto, and a reaction was allowed at 100° C. for 6 hrs. The reaction liquid was cooled to no greater than 30° C., 300 g of propylene glycol monomethyl ether acetate was added thereto, and methyl isobutyl ketone was eliminated by concentration under reduced pressure to give a propylene glycol monomethyl ether acetate solution of the polymer (A-10). The Mw of the polymer (A-10) was 2,400.

Synthesis Example 1-10: Synthesis of Polymer (A-11)

1.60 g of 2,6-naphthalenediol, 1.82 g of 4-biphenylaldehyde, and 30 ml of methyl isobutyl ketone were charged into a reaction vessel, 5 ml of 95% sulfuric acid was added thereto, and a reaction was allowed at 100° C. for 6 hrs. Next, a resulting reaction liquid was concentrated, 50 g of pure water was added thereto, a resulting reaction product was precipitated and cooled to room temperature, and separation was performed by filtration. A solid thus obtained was filtered and dried, and then separation and purification were performed by column chromatography. 10 g of this compound, 0.7 g of paraformaldehyde, 50 ml of glacial acetic acid, and 50 ml of PGME were charged, 8 ml of 95% sulfuric acid was added thereto, and a reaction was allowed at 100° C. for 6 hrs. Next, a resulting reaction liquid was concentrated, 1,000 ml of methanol was added thereto, a resulting reaction product was precipitated and cooled to room temperature, and separation was performed by filtration. A solid thus obtained was filtered and dried, and then separation and purification were performed by column chromatography to give the polymer (A-11). The Mw of the polymer (A-11) was 1,793.

Synthesis Example 1-11: Synthesis of Polymer (A-12)

100.0 g of 3,4-dihydroxyphenyl methacrylate was dissolved in 130 g of methyl ethyl ketone, and 16.6 g of dimethyl 2,2'-azobis(2-methylpropionate) was added thereto to prepare a monomer solution. 70 g of methyl ethyl ketone was charged into a reaction vessel in a nitrogen atmosphere and heated to 78° C., and the monomer solution was added dropwise thereto over 3 hrs with stirring. Onset of the dropwise addition was regarded as the time point of the start of the polymerization reaction, and the polymerization reaction was performed for 6 hrs, followed by cooling to no greater than 30° C. 300 g of propylene glycol monomethyl ether acetate was added to a thus resulting reaction solution, and methyl ethyl ketone was eliminated by concentration under reduced pressure to give a propylene glycol monomethyl ether acetate solution of the polymer (A-12). The Mw of the polymer (A-12) was 4,200.

Synthesis Example 1-12: Synthesis of Polymer (A-13)

A propylene glycol monomethyl ether acetate solution of the polymer (A-13) was obtained by a similar operation to that of Synthesis Example 1-12, except that 4-hydroxyphenyl methacrylate was used in place of 3,4-dihydroxyphenyl methacrylate. The Mw of the polymer (A-13) was 3,900.

Synthesis Example 1-13: Synthesis of Polymer (A-14)

18.71 g of 4-acetoxystyrene and 81.29 g of benzyl methacrylate were dissolved in 130 g of 1-methoxy-3-propanol, and 27.9 g of dimethyl 2,2'-azobis(2-methylpropionate) was added thereto to prepare a monomer solution. 70 g of 1-methoxy-3-propanol was charged into a reaction vessel in a nitrogen atmosphere and heated to 80° C., and the monomer solution was added dropwise thereto over 3 hrs with stirring. Onset of the dropwise addition was regarded as the time point of the start of the polymerization reaction, and the polymerization reaction was performed for 6 hrs, followed by cooling to no greater than 30° C. To a resulting reaction solution were added 180 g of methanol, 48.1 g of triethylamine, and 8.6 g of water, a resulting solution was heated to 70° C., a reaction was allowed for 6 hrs with stirring, and then the solution was cooled to no greater than 30° C. To a thus cooled solution were added 300 g of methyl isobutyl ketone and 1,000 g of a 5% aqueous oxalic acid solution, extraction by liquid separation was conducted, and then reprecipitation was carried out by charging into hexane. A supernatant liquid was eliminated by decantation, 300 g of propylene glycol monomethyl ether acetate was added thereto, and concentration under reduced pressure was performed to give a propylene glycol monomethyl ether acetate solution of the polymer (A-14). The Mw of the polymer (A-14) was 3,600.

Synthesis Example 1-14: Synthesis of Compound (A-15)

50.0 g of 3,6,11,14-tetrahydroxy dibenzochrysene, 25.5 g of sodium hydroxide, and 200 g of water were made into a uniform solution at 40° C. in a nitrogen atmosphere. 61.2 g of 37% formalin was added dropwise over 1 hour, and then stirring was performed as-is thereafter at 40° C. for 8 hrs. 800 g of methyl isobutyl ketone was added to the solution, and then 120 g of a 20% aqueous hydrochloric acid solution was added while cooling over an ice bath to terminate the reaction. Insoluble matter was filtered off, an aqueous layer was removed, and an organic layer was washed five times with 200 g of pure water. The organic layer was brought to dryness under reduced pressure, dissolved in 250 g of tetrahydrofuran, and charged into diisopropyl ether to permit reprecipitation. The precipitate was filtered off and washed twice with 200 g of diisopropyl ether, and then dried in vacuo at 50° C. 20.0 g of this compound and 121.6 g of methanol were made into a uniform solution at 50° C. in a nitrogen atmosphere, and then 6.2 g of a 10% by weight solution of sulfuric acid in methanol was gradually added dropwise, and stirring was conducted for 8 hrs under a reflux condition. A thus resulting mixture was cooled to room temperature, followed by adding 300 g of methyl isobutyl ketone and 100 g of pure water thereto. Insoluble matter was filtered off, an aqueous layer was removed, and an organic layer was washed five times with 200 g of pure water. The organic layer was brought to dryness under reduced pressure, dissolved in 60 g of toluene, and charged into hexane to permit reprecipitation. The precipitate was filtered off, washed twice with 100 g of hexane, and dried in vacuo at 50° C. to give the compound (A-15).

Synthesis Example 1-15: Synthesis of Compound (A-16)

While stirring 39.2 g of 3,6,11,14-tetrahydroxydibenzochrysene, 66.9 g of potassium carbonate, and 180 g of dimethylformamide at 50° C. in a nitrogen atmosphere, 52.3 g of propargyl bromide was added dropwise over 40 min. After completion of the dropwise addition, stirring was continued as-is at 50° C. for 24 hrs. Thereafter, 500 g of methyl isobutyl ketone and 100 g of pure water were added thereto. Insoluble matter was filtered off, an aqueous layer was removed, and then an organic layer was washed four times with 100 g of pure water. The organic layer was brought to dryness under reduced pressure, dissolved in 150 g of toluene, and charged into methanol to permit reprecipitation. The precipitate was filtered off, washed twice with 200 g of methanol, and dried in vacuo at 50° C. to give the compound (A-16).

Synthesis Example 1-16: Synthesis of Compound (a-17)

Into a reaction vessel were charged 20.0 g of 2-acetylfluorene and 20.0 g of m-xylene in a nitrogen atmosphere, and dissolution was allowed at 110° C. Next, 3.14 g of dodecylbenzenesulfonic acid was added, a resulting solution was heated to 140° C., and a reaction was allowed for 16 hrs. After completion of the reaction, the reaction liquid was diluted by adding 80 g of xylene, followed by cooling to 50° C. and charging into 500 g of methanol to permit reprecipitation. A thus obtained precipitate was washed with toluene and a solid was collected on a filter paper and dried to give a compound (hereinafter, may be also referred to as "compound (a-17)") represented by the following formula (a-17).

(a-17)

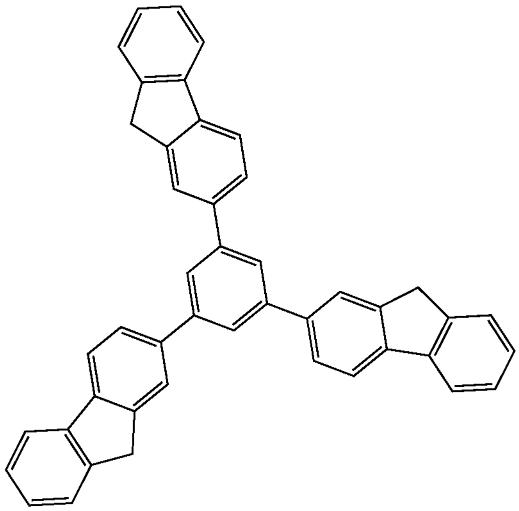

Synthesis Example 1-17: Synthesis of Compound (A-17)

Into a reaction vessel were charged 10.0 g of the compound (a-17), 7.2 g of m-ethynylbenzaldehyde, and 40 g of toluene in a nitrogen atmosphere, followed by stirring. To a thus resulting solution were added 25.2 g of a 50% by mass aqueous sodium hydroxide solution and 1.7 g of tetrabutylammonium bromide, and a reaction was allowed at room temperature for 6 hrs. After the reaction, 25 g of tetrahydrofuran was added thereto. An aqueous layer was removed, followed by charging 50 g of a 1% by mass aqueous oxalic acid solution and conducting extraction by liquid separation, and then charging into hexane to permit reprecipitation. The precipitate was collected by filtration to give the compound (A-17).

Synthesis Example 1-18: Synthesis of Polymer (A-18)

To 15.55 g of 4,4-(hexafluoroisopropylidene)diphthalic anhydride and 14.62 g of 1,3-bis(3-aminophenoxy)benzene was added 120 g of N-methyl-2-pyrrolidone, and a reaction was allowed at 40° C. for 3 hrs in a nitrogen atmosphere. To a thus obtained compound was added 5.16 g of 4-ethynylphthalic anhydride, and a reaction was further allowed at 40° C. for 3 hrs. To a thus obtained reaction liquid was added 4.00 g of pyridine, 12.25 g of acetic anhydride was further added dropwise, and a reaction was allowed at 60° C. for 4 hrs. After completion of the reaction, the reaction liquid was cooled to room temperature, 400 g of methyl isobutyl ketone was added thereto, an organic layer was washed twice with 100 g of a 3% aqueous nitric acid solution, and then further washing was conducted six times with 100 g of pure water and the organic layer was brought to dryness under reduced pressure. To the dried organic layer was added 100 g of THF, followed by charging into methanol to permit reprecipitation. The precipitate was filtered off, washed twice with 300 g of methanol, and dried in vacuo at 70° C. to give the polymer (A-18). The Mw of the polymer (A-18) was 4,320.

Synthesis Example 1-19: Synthesis of Polymer (A-19)

To 30.0 g of 9-propargyl-9-fluorenol were gradually added 200 g of 1,2-dichloroethane and 13.1 g of methanesulfonate in a nitrogen atmosphere, and a reaction was allowed at 70° C. for 8 hrs. A thus resulting solution was cooled to room temperature, and then 500 g of toluene was added thereto, washing was conducted six times with 100 g of pure water, and an organic layer was brought to dryness under reduced pressure. To the dried organic layer was added 100 g of THF, followed by charging into methanol to permit reprecipitation. The precipitate was filtered off, washed twice with 200 g of methanol, and dried in vacuo at 70° C. to give the polymer (A-19). The Mw of the polymer (A-19) was 2,450.

Synthesis Example 1-20: Synthesis of Compound (A-20)

To 7.91 g of 1,5-diaminonaphthalene and 17.21 g of 4-ethynylphthalic anhydride was added 120 g of N-methyl-2-pyrrolidone, and a reaction was allowed at 40° C. for 3 hrs in a nitrogen atmosphere. To a thus obtained reaction liquid was added 3.96 g of pyridine, and 12.26 g of acetic anhydride was further gradually added dropwise and a reaction was allowed at 60° C. for 4 hrs. After completion of the reaction, the reaction liquid was cooled to room temperature and 300 g of methyl isobutyl ketone was added thereto, an organic layer was washed with 100 g of a 3% aqueous nitric acid solution, and then further washing was conducted five times with 100 g of pure water and the organic layer was brought to dryness under reduced pressure. To the dried organic layer was added 100 g of THF, followed by charging into methanol to permit reprecipitation. The precipitate was filtered off, washed twice with 200 g of methanol, and dried in vacuo at 70° C. to give the compound (A-20).

Synthesis Example 1-21: Synthesis of Compound (A-21)

To 32.13 g of 9,9-bis[4-(3,4-dicarboxyphenoxy)phenyl] fluorene dianhydride was added 100 g of N-methyl-2-pyrrolidone, and 9.31 g of aniline newly dissolved in 30 g of N-methyl-2-pyrrolidone was gradually added thereto dropwise in a nitrogen atmosphere and a reaction was allowed at 40° C. for 3 hrs. To a thus obtained solution was added 130 g of o-xylene, and a reaction was allowed at 180° C. for 9 hrs while eliminating water generated from the system. After completion of the reaction, the reaction liquid was cooled to room temperature, followed by charging into methanol to permit reprecipitation. The precipitate was filtered off, washed twice with 300 g of methanol, and dried in vacuo at 70° C. to give the compound (A-21).

Synthesis of Polymer (B)

As the polymer (B), polymers (hereinafter, may be also referred to as "polymers (B-1) to (B-10) and (b-1)") represented by the following formulae (B-1) to (B-10) and (b-1) were synthesized by procedures shown below.

(B-1)

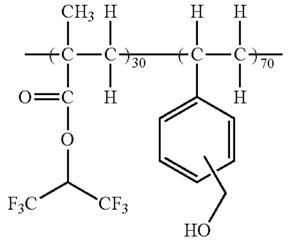

(B-2)

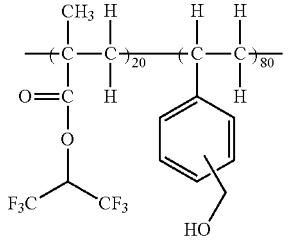

(B-3)

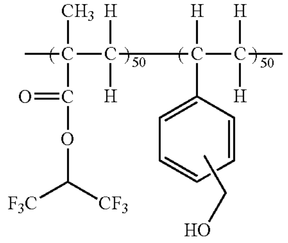

(B-4)

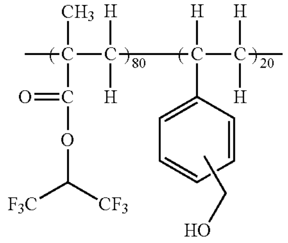

(B-5)

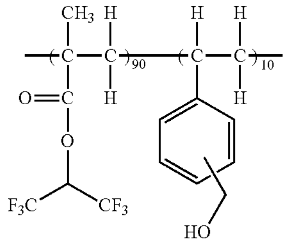

(B-6)

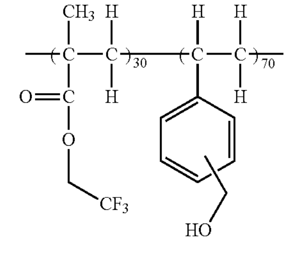

-continued (B-7)

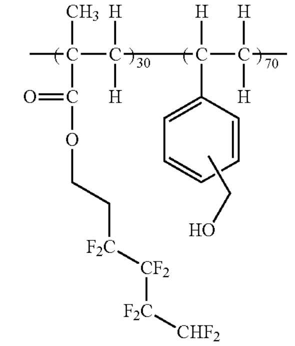

(B-8)

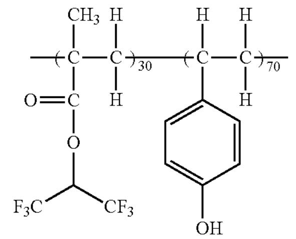

(B-9)

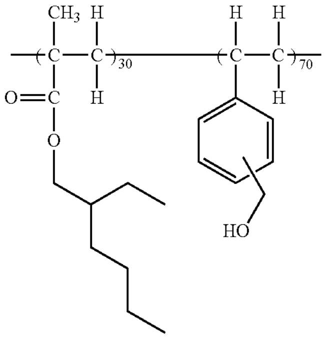

(B-10)

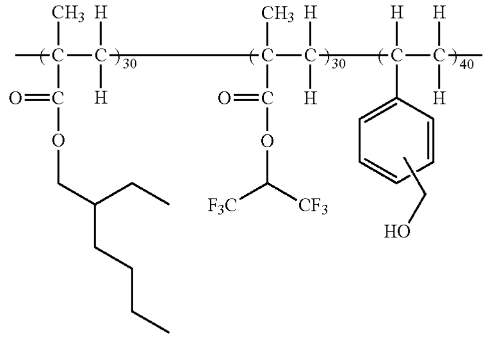

(b-1)

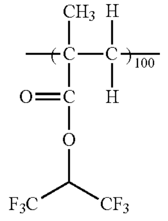

In the above formulae (B-1) to (B-10) and (b-1), numbers appended to each structural unit indicate a content (mol %) of that structural unit.

Synthesis Example 2-1: Synthesis of Polymer (B-1)

43.0 g of 1,1,1,3,3,3-hexafluoroisopropyl methacrylate and 57.0 g of vinylbenzyl alcohol were dissolved in 130 g of methyl isobutyl ketone, and 19.6 of dimethyl 2,2'-azobis (2-methylpropionate) were added thereto to prepare a monomer solution. 70 g of methyl isobutyl ketone was charged into a reaction vessel in a nitrogen atmosphere and heated to 80° C., and the monomer solution was added dropwise thereto over 3 hrs with stirring. Onset of the dropwise addition was regarded as the time point of the start of the polymerization reaction, and the polymerization reaction was performed for 6 hrs, followed by cooling to no greater than 30° C. 300 g of propylene glycol monomethyl ether acetate was added to a thus resulting reaction solution, and methyl isobutyl ketone was eliminated by concentration under reduced pressure to give a propylene glycol monomethyl ether acetate solution of the polymer (B-1). The Mw of the polymer (B-1) was 4,200.

Synthesis Examples 2-2 to 2-11: Synthesis of Polymers (B-2) to (B-10) and (b-1)

Propylene glycol monomethyl ether acetate solutions of polymers (B-2) to (B-10) and (b-1) were each obtained by a similar operation to that of Synthesis Example 2-1, except that monomers that give each structural unit in each proportion (mol %) shown in the above formulae (B-2) to (B-10) and (b-1) were used. The Mw of the polymer (B-2) was 3,800, the Mw of the polymer (B-3) was 4,000, the Mw of the polymer (B-4) was 4,300, the Mw of the polymer (B-5) was 4,500, the Mw of the polymer (B-6) was 4,100, the Mw of the polymer (13-7) was 4,100, the Mw of the polymer (B-8) was 4,200, the Mw of the polymer (B-9) was 4,200, the Mw of the polymer (B-10) was 4,300, and the Mw of the polymer (b-1) was 4,100.

Preparation of Composition

The organic solvent (C), the acid generating agent (D), and the crosslinking agent (E) used in preparation of the compositions are shown below.

(C) Acid Generating Agent

C-1: propylene glycol monomethyl ether acetate

C-2: 1,6-diacetoxyacetone

C-3: γ-butyrolactone

C-4: diethylene glycol dibutyl ether (D) Acid Generating Agent

D-1: bis(4-t-butylphenyl)iodonium nonafluoro-n-butanesulfonate (a compound represented by the following formula (D-1))

(D-1)

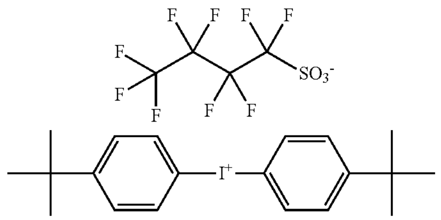

(E) Crosslinking Agent

E-1: 1,3,4,6-tetrakis(methoxymethyl)glycoluril (a compound represented by the following formula (E-1))

(E-1)

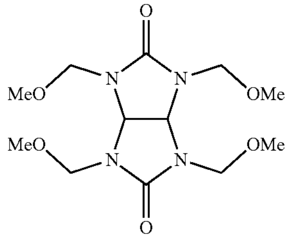

Example 1: Preparation of Composition (J-1)

100 parts by mass of (A-1) as the compound (A), 3 parts by mass (excluding the propylene glycol monomethyl ether acetate solvent) of (B-1) as the polymer (B), and 1,300 parts by mass of (C-1) as the organic solvent (C) (including the propylene glycol monomethyl ether acetate solvent in the polymer (B) solution) were mixed together, and a thus obtained mixture was filtered through a polytetrafluoroethylene (PTFE) filter having a pore size of 0.2 μm to give the composition (J-1).

Examples 2 to 75 and Comparative Examples 1 to 22: Preparation of Compositions (J-2) to (J-74) and (CJ-1) to (CJ-22)

Compositions (J-2) to (J-74) and (CJ-1) to (CJ-22) were prepared in a similar manner to Example 1, except that for each component, the type and content shown in Table 1 below were used.

TABLE 1

| | | (A) Compound | | (B) Polymer | | (C) Organic Solvent | | (D) Acid generating agent | | (E) Crosslinking agent | |
|---|---|---|---|---|---|---|---|---|---|---|---|
| | Composition | type | content (parts by mass) | type | content (parts by mass) | type | content (parts by mass) | type | content (parts by mass) | type | content (parts by mass) |
| Example 1 | J-1 | A-1 | 100 | B-1 | 3 | C-1 | 1,300 | — | — | — | — |
| Example 2 | J-2 | A-2 | 100 | B-1 | 3 | C-1 | 1,300 | — | — | — | — |
| Example 3 | J-3 | A-3 | 100 | B-1 | 3 | C-1 | 1,300 | — | — | — | — |
| Example 4 | J-4 | A-4 | 100 | B-1 | 3 | C-1 | 1,300 | — | — | — | — |
| Example 5 | J-5 | A-5 | 100 | B-1 | 3 | C-1 | 1,300 | — | — | — | — |
| Example 6 | J-6 | A-6 | 100 | B-1 | 3 | C-1 | 1,300 | — | — | — | — |
| Example 7 | J-7 | A-7 | 100 | B-1 | 3 | C-1 | 1,300 | — | — | — | — |
| Example 8 | J-8 | A-8 | 100 | B-1 | 3 | C-1 | 1,300 | — | — | — | — |
| Example 9 | J-9 | A-2 | 100 | B-2 | 3 | C-1 | 1,300 | — | — | — | — |
| Example 10 | J-10 | A-3 | 100 | B-2 | 3 | C-1 | 1.300 | — | — | — | — |
| Example 11 | J-11 | A-4 | 100 | B-2 | 3 | C-1 | 1,300 | — | — | — | — |
| Example 12 | J-12 | A-5 | 100 | B-2 | 3 | C-1 | 1,300 | — | — | — | — |
| Example 13 | J-13 | A-2 | 100 | B-3 | 3 | C-1 | 1,300 | — | — | — | — |
| Example 14 | J-14 | A-3 | 100 | B-3 | 3 | C-1 | 1,300 | — | — | — | — |
| Example 15 | J-15 | A-4 | 100 | B-3 | 3 | C-1 | 1,300 | — | — | — | — |
| Example 16 | J-16 | A-5 | 100 | B-3 | 3 | C-1 | 1,300 | — | — | — | — |
| Example 17 | J-17 | A-2 | 100 | B-4 | 3 | C-1 | 1,300 | — | — | — | — |
| Example 18 | J-18 | A-3 | 100 | B-4 | 3 | C-1 | 1,300 | — | — | — | — |
| Example 19 | J-19 | A-4 | 100 | B-4 | 3 | C-1 | 1,300 | — | — | — | — |
| Example 20 | J-20 | A-5 | 100 | B-4 | 3 | C-1 | 1,300 | — | — | — | — |
| Example 21 | J-21 | A-2 | 100 | B-5 | 3 | C-1 | 1,300 | — | — | — | — |
| Example 22 | J-22 | A-3 | 100 | B-5 | 3 | C-1 | 1,300 | — | — | — | — |
| Example 23 | J-23 | A-4 | 100 | B-5 | 3 | C-1 | 1,300 | — | — | — | — |
| Example 24 | J-24 | A-5 | 100 | B-5 | 3 | C-1 | 1,300 | — | — | — | — |
| Example 25 | J-25 | A-2 | 100 | B-6 | 3 | C-1 | 1,300 | — | — | — | — |
| Example 26 | J-26 | A-3 | 100 | B-6 | 3 | C-1 | 1,300 | — | — | — | — |
| Example 27 | J-27 | A-4 | 100 | B-6 | 3 | C-1 | 1,300 | — | — | — | — |
| Example 28 | J-28 | A-5 | 100 | B-6 | 3 | C-1 | 1,300 | — | — | — | — |
| Example 29 | J-29 | A-2 | 100 | B-7 | 3 | C-1 | 1,300 | — | — | — | — |
| Example 30 | J-30 | A-3 | 100 | B-7 | 3 | C-1 | 1,300 | — | — | — | — |
| Example 31 | J-31 | A-4 | 100 | B-7 | 3 | C-1 | 1,300 | — | — | — | — |
| Example 32 | J-32 | A-5 | 100 | B-7 | 3 | C-1 | 1,300 | — | — | — | — |
| Example 33 | J-33 | A-2 | 100 | B-8 | 3 | C-1 | 1,300 | — | — | — | — |
| Example 34 | J-34 | A-3 | 100 | B-8 | 3 | C-1 | 1,300 | — | — | — | — |
| Example 35 | J-35 | A-4 | 100 | B-8 | 3 | C-1 | 1,300 | — | — | — | — |
| Example 36 | J-36 | A-5 | 100 | B-8 | 3 | C-1 | 1,300 | — | — | — | — |
| Example 37 | J-37 | A-2 | 100 | B-9 | 3 | C-1 | 1,300 | — | — | — | — |
| Example 38 | J-38 | A-3 | 100 | B-9 | 3 | C-1 | 1,300 | — | — | — | — |
| Example 39 | J-39 | A-4 | 100 | B-9 | 3 | C-1 | 1,300 | — | — | — | — |
| Example 40 | J-40 | A-5 | 100 | B-9 | 3 | C-1 | 1,300 | — | — | — | — |
| Example 41 | J-41 | A-2 | 100 | B-10 | 3 | C-1 | 1,300 | — | — | — | — |
| Example 42 | J-42 | A-3 | 100 | B-10 | 3 | C-1 | 1,300 | — | — | — | — |
| Example 43 | J-43 | A-4 | 100 | B-10 | 3 | C-1 | 1,300 | — | — | — | — |
| Example 44 | J-44 | A-5 | 100 | B-10 | 3 | C-1 | 1,300 | — | — | — | — |
| Example 45 | J-45 | A-1 | 100 | B-1 | 1 | C-1 | 1,275 | — | — | — | — |
| Example 46 | J-46 | A-1 | 100 | B-1 | 5 | C-1 | 1,325 | — | — | — | — |
| Example 47 | J-47 | A-1 | 100 | B-1 | 10 | C-1 | 1,388 | — | — | — | — |
| Example 48 | J-48 | A-1 | 100 | B-1 | 20 | C-1 | 2,518 | — | — | — | — |
| Example 49 | J-49 | A-1 | 100 | B-1 | 3 | C-1/C-2 | 1,170/130 | — | — | — | — |
| Example 50 | J-50 | A-1 | 100 | B-1 | 3 | C-1/C-3 | 1,170/130 | — | — | — | — |
| Example 51 | J-51 | A-1 | 100 | B-1 | 3 | C-1/C-4 | 1,170/130 | — | — | — | — |
| Example 52 | J-52 | A-1 | 100 | B-1 | 3 | C-1 | 1,477 | D-1 | 4 | E-1 | 10 |

TABLE 1-continued

| | Composition | (A) Compound type | (A) Compound content (parts by mass) | (B) Polymer type | (B) Polymer content (parts by mass) | (C) Organic Solvent type | (C) Organic Solvent content (parts by mass) | (D) Acid generating agent type | (D) Acid generating agent content (parts by mass) | (E) Crosslinking agent type | (E) Crosslinking agent content (parts by mass) |
|---|---|---|---|---|---|---|---|---|---|---|---|
| Comparative Example 1 | CJ-1 | A-1 | 100 | — | — | C-1 | 1,000 | — | — | — | — |
| Comparative Example 2 | CJ-2 | A-2 | 100 | — | — | C-1 | 1,000 | — | — | — | — |
| Comparative Example 3 | CJ-3 | A-3 | 100 | — | — | C-1 | 1,000 | — | — | — | — |
| Comparative Example 4 | CJ-4 | A-4 | 100 | — | — | C-1 | 1,000 | — | — | — | — |
| Comparative Example 5 | CJ-5 | A-5 | 100 | — | — | C-1 | 1,000 | — | — | — | — |
| Comparative Example 6 | CJ-6 | A-6 | 100 | — | — | C-1 | 1,000 | — | — | — | — |
| Comparative Example 7 | CJ-7 | A-7 | 100 | — | — | C-1 | 1,000 | — | — | — | — |
| Comparative Example 8 | CJ-8 | A-8 | 100 | — | — | C-1 | 1,000 | — | — | — | — |
| Comparative Example 9 | CJ-9 | A-3 | 100 | b-1 | 3 | C-1 | 1,300 | — | — | — | — |

TABLE 2

| | Composition | (A) Compound type | (A) Compound content (parts by mass) | (B) Polymer type | (B) Polymer content (parts by mass) | (C) Organic Solvent type | (C) Organic Solvent content (parts by mass) | (D) Acid generating agent type | (D) Acid generating agent content (parts by mass) | (E) Crosslinking agent type | (E) Crosslinking agent content (parts by mass) |
|---|---|---|---|---|---|---|---|---|---|---|---|
| Example 53 | J-53 | A-8 | 100 | B-2 | 3 | C-1 | 1,300 | — | — | — | — |
| Example 54 | J-54 | A-8 | 100 | B-3 | 3 | C-1 | 1,300 | — | — | — | — |
| Example 55 | J-55 | A-8 | 100 | B-4 | 3 | C-1 | 1,300 | — | — | — | — |
| Example 56 | J-56 | A-8 | 100 | B-5 | 3 | C-1 | 1,300 | — | — | — | — |
| Example 57 | J-57 | A-8 | 100 | B-6 | 3 | C-1 | 1,300 | — | — | — | — |
| Example 58 | J-58 | A-8 | 100 | B-7 | 3 | C-1 | 1,300 | — | — | — | — |
| Example 59 | J-59 | A-8 | 100 | B-8 | 3 | C-1 | 1,300 | — | — | — | — |
| Example 60 | J-60 | A-8 | 100 | B-9 | 3 | C-1 | 1,300 | — | — | — | — |
| Example 61 | J-61 | A-8 | 100 | B-10 | 3 | C-1 | 1,300 | — | — | — | — |
| Example 62 | J-62 | A-9 | 100 | B-1 | 3 | C-1 | 1,300 | — | — | — | — |
| Example 63 | J-63 | A-10 | 100 | B-1 | 3 | C-1 | 1,300 | — | — | — | — |
| Example 64 | J-64 | A-11 | 100 | B-1 | 3 | C-1 | 1,300 | — | — | — | — |
| Example 65 | J-65 | A-12 | 100 | B-1 | 3 | C-1 | 1,300 | — | — | — | — |
| Example 66 | J-66 | A-13 | 100 | B-1 | 3 | C-1 | 1,300 | — | — | — | — |
| Example 67 | J-67 | A-14 | 100 | B-1 | 3 | C-1 | 1,300 | — | — | — | — |
| Example 68 | J-68 | A-15 | 100 | B-1 | 3 | C-1 | 1,300 | — | — | — | — |
| Example 69 | J-69 | A-16 | 100 | B-1 | 3 | C-1 | 1,300 | — | — | — | — |
| Example 70 | J-70 | A-17 | 100 | B-1 | 3 | C-1 | 1,300 | — | — | — | — |
| Example 71 | J-71 | A-18 | 100 | B-1 | 3 | C-1 | 1,300 | — | — | — | — |
| Example 72 | J-72 | A-19 | 100 | B-1 | 3 | C-1 | 1,300 | — | — | — | — |
| Example 73 | J-73 | A-20 | 100 | B-1 | 3 | C-1 | 1,300 | — | — | — | — |
| Example 74 | J-74 | A-21 | 100 | B-1 | 3 | C-1 | 1,300 | — | — | — | — |
| Comparative Example 10 | CJ-10 | A-9 | 100 | — | — | C-1 | 1,000 | — | — | — | — |
| Comparative Example 11 | CJ-11 | A-10 | 100 | — | — | C-1 | 1,000 | — | — | — | — |
| Comparative Example 12 | CJ-12 | A-11 | 100 | — | — | C-1 | 1,000 | — | — | — | — |
| Comparative Example 13 | CJ-13 | A-12 | 100 | — | — | C-1 | 1,000 | — | — | — | — |
| Comparative Example 14 | CJ-14 | A-13 | 100 | — | — | C-1 | 1,000 | — | — | — | — |
| Comparative Example 15 | CJ-15 | A-14 | 100 | — | — | C-1 | 1,000 | — | — | — | — |
| Comparative Example 16 | CJ-16 | A-15 | 100 | — | — | C-1 | 1,000 | — | — | — | — |
| Comparative Example 17 | CJ-17 | A-16 | 100 | — | — | C-1 | 1,000 | — | — | — | — |
| Comparative Example 18 | CJ-18 | A-17 | 100 | — | — | C-1 | 1,000 | — | — | — | — |
| Comparative Example 19 | CJ-19 | A-18 | 100 | — | — | C-1 | 1,000 | — | — | — | — |
| Comparative Example 20 | CJ-20 | A-19 | 100 | — | — | C-1 | 1,000 | — | — | — | — |

TABLE 2-continued

| | | (A) Compound | | (B) Polymer | | (C) Organic Solvent | | (D) Acid generating agent | | (E) Crosslinking agent | |
|---|---|---|---|---|---|---|---|---|---|---|---|
| | Composition | type | content (parts by mass) | type | content (parts by mass) | type | content (parts by mass) | type | content (parts by mass) | type | content (parts by mass) |
| Comparative Example 21 | CJ-21 | A-20 | 100 | — | — | C-1 | 1,000 | — | — | — | — |
| Comparative Example 22 | CJ-22 | A-21 | 100 | — | — | C-1 | 1,000 | — | — | — | — |

Evaluations

Resist underlayer films formed using compositions prepared as described above were evaluated on the flatness and heat resistance in accordance with the following methods. The evaluation results are shown in Table 3 and Table 4 below.

Flatness

Each of the compositions prepared as described above was applied by a spin-coating procedure using a spin coater ("CLEAN TRACK ACT 12," available from Tokyo Electron Limited), on a silicon substrate 1 provided with a trench pattern having a depth of 150 nm and a groove width of 10 μm formed thereon, as shown in the FIGURE. Subsequently, heating was performed in an ambient air atmosphere at 250° C. for 60 sec, followed by cooling at 23° C. for 60 sec to form a resist underlayer film 2 having an average thickness of 300 nm at parts having no trench provided, giving a resist underlayer film-attached silicon substrate. A cross-sectional shape of the resist underlayer film-attached silicon substrate was observed by using a scanning electron microscope ("S-4800," available from Hitachi High-Technologies Corporation), and the difference (ΔFT) between a height at a center portion "b" of the trench pattern of the resist underlayer film 2 and a height at a position "a" 5 μm away from the edge of the trench pattern, at which no trench pattern was provided, was defined as a marker of the flatness. The flatness was evaluated to be: "A" (extremely favorable) in a case of ΔFT being less than 30 nm; "B" (favorable) in a case of ΔFT being no less than 30 nm and less than 40 nm; "C" (somewhat favorable) in a case of ΔFT being no less than 40 nm and less than 50 nm; and "D" (unfavorable) in a case of ΔFT being no less than 50 nm. It is to be noted that the difference in heights shown in the FIG. 1s exaggerated.

Heat Resistance

Each of the compositions prepared as described above was applied by a spin-coating procedure using a spin coater ("CLEAN TRACK ACT 12," available from Tokyo Electron Limited), on a silicon wafer (substrate). Subsequently, heating was performed in an ambient air atmosphere at 120° C. for 60 sec, followed by cooling at 23° C. for 60 sec to form a resist underlayer film having an average thickness of 200 nm. Accordingly, a resist underlayer film-attached substrate, the resist underlayer film being formed on the substrate, was obtained. The resist underlayer film of the thus obtained resist underlayer film-attached substrate was scraped to collect a powder, the powder of the resist underlayer film was placed into a container used for measurement by a TG-DTA apparatus ("TG-DTA 2000SR," available from NETZSCIH), and a mass of the powder prior to heating was measured. The powder was then heated to 250° C. in the TG-DTA apparatus in an ambient atmosphere with a rate of temperature rise of 10° C./min, and the mass of the powder was measured upon reaching 250° C. The mass loss rate (%) was determined by the following equation, and this mass loss rate was defined as a marker of heat resistance.

$$M_L=\{(m1-m2)/m1\}\times 100$$

In the above equation, $M_L$ represents the mass loss rate (%); m1 represents the mass prior to heating (mg); and m2 represents the mass at 250° C. (mg).

A lower mass loss rate of the powder used as the sample indicates that the heat resistance is more favorable, due to less generation of sublimated matter and resist underlayer film degradation products during the heating of the resist underlayer film. In brief, the lower mass loss rate indicates higher heat resistance. The heat resistance was evaluated to be: "A" (favorable) in a case in which the mass loss rate was less than 5%; and "B" (unfavorable) in a case in which the mass loss rate was no less than 5%.

TABLE 3

| | Composition | Flatness | Heat resistance |
|---|---|---|---|
| Example 1 | J-1 | A | A |
| Example 2 | J-2 | A | A |
| Example 3 | J-3 | A | A |
| Example 4 | J-4 | A | A |
| Example 5 | J-5 | A | A |
| Example 6 | J-6 | A | A |
| Example 7 | J-7 | A | A |
| Example 8 | J-8 | A | A |
| Example 9 | J-9 | B | A |
| Example 10 | J-10 | B | A |
| Example 11 | J-11 | B | A |
| Example 12 | J-12 | B | A |
| Example 13 | J-13 | A | A |
| Example 14 | J-14 | A | A |
| Example 15 | J-15 | A | A |
| Example 16 | J-16 | A | A |
| Example 17 | J-17 | B | A |
| Example 18 | J-18 | B | A |
| Example 19 | J-19 | B | A |
| Example 20 | J-20 | B | A |
| Example 21 | J-21 | C | A |
| Example 22 | J-22 | C | A |
| Example 23 | J-23 | C | A |
| Example 24 | J-24 | C | A |
| Example 25 | J-25 | A | A |
| Example 26 | J-26 | A | A |
| Example 27 | J-27 | A | A |
| Example 28 | J-28 | A | A |
| Example 29 | J-29 | A | A |
| Example 30 | J-30 | A | A |
| Example 31 | J-31 | A | A |
| Example 32 | J-32 | A | A |
| Example 33 | J-33 | C | A |
| Example 34 | J-34 | C | A |
| Example 35 | J-35 | C | A |
| Example 36 | J-36 | C | A |
| Example 37 | J-37 | C | A |
| Example 38 | J-38 | C | A |
| Example 39 | J-39 | C | A |
| Example 40 | J-40 | C | A |
| Example 41 | J-41 | A | A |

TABLE 3-continued

| | Composition | Flatness | Heat resistance |
|---|---|---|---|
| Example 42 | J-42 | A | A |
| Example 43 | J-43 | A | A |
| Example 44 | J-44 | A | A |
| Example 45 | J-45 | A | A |
| Example 46 | J-46 | A | A |
| Example 47 | J-47 | A | A |
| Example 48 | J-48 | A | B |
| Example 49 | J-49 | A | A |
| Example 50 | J-50 | A | A |
| Example 51 | J-51 | A | A |
| Example 52 | J-52 | A | A |
| Comparative Example 1 | CJ-1 | D | A |
| Comparative Example 2 | CJ-2 | D | A |
| Comparative Example 3 | CJ-3 | D | A |
| Comparative Example 4 | CJ-4 | D | A |
| Comparative Example 5 | CJ-5 | D | A |
| Comparative Example 6 | CJ-6 | D | A |
| Comparative Example 7 | CJ-7 | D | A |
| Comparative Example 8 | CJ-8 | D | A |
| Comparative Example 9 | CJ-9 | D | A |

TABLE 4

| | Composition | Flatness | Heat resistance |
|---|---|---|---|
| Example 53 | J-53 | B | A |
| Example 54 | J-54 | A | A |
| Example 55 | J-55 | B | A |
| Example 56 | J-56 | C | A |
| Example 57 | J-57 | A | A |
| Example 58 | J-58 | A | A |
| Example 59 | J-59 | C | A |
| Example 60 | J-60 | C | A |
| Example 61 | J-61 | A | A |
| Example 62 | J-62 | A | A |
| Example 63 | J-63 | A | A |
| Example 64 | J-64 | A | A |
| Example 65 | J-65 | A | A |
| Example 66 | J-66 | A | A |
| Example 67 | J-67 | A | A |
| Example 68 | J-68 | A | A |
| Example 69 | J-69 | A | A |
| Example 70 | J-70 | A | A |
| Example 71 | J-71 | A | A |
| Example 72 | J-72 | A | A |
| Example 73 | J-73 | A | A |
| Example 74 | J-74 | A | A |
| Comparative Example 10 | CJ-10 | D | A |
| Comparative Example 11 | CJ-11 | D | A |
| Comparative Example 12 | CJ-12 | D | A |
| Comparative Example 13 | CJ-13 | D | A |
| Comparative Example 14 | CJ-14 | D | A |
| Comparative Example 15 | CJ-15 | D | A |
| Comparative Example 16 | CJ-16 | D | A |
| Comparative Example 17 | CJ-17 | D | A |

TABLE 4-continued

| | Composition | Flatness | Heat resistance |
|---|---|---|---|
| Comparative Example 18 | CJ-18 | D | A |
| Comparative Example 19 | CJ-19 | D | A |
| Comparative Example 20 | CJ-20 | D | A |
| Comparative Example 21 | CJ-21 | D | A |
| Comparative Example 22 | CJ-22 | D | A |

As is seen from the results shown in Table 3 and Table 4, the resist underlayer films formed from the compositions of the Examples were superior to the resist underlayer films formed from the compositions of the Comparative Examples in terms of the heat resistance and the flatness.

The composition and the method of forming a resist underlayer film of the embodiments of the present invention enable forming a resist underlayer film being superior in terms of heat resistance and flatness. The method of forming a resist pattern of the still another embodiment of the present invention enables forming a resist pattern having a favorable configuration. Therefore, these can be suitably used in the manufacture of semiconductor devices and the like, in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

What is claimed is:

1. A composition comprising:

a compound comprising an aromatic ring; and a first polymer comprising a first structural unit represented by formula (1) and a second structural unit represented by formula (2), wherein a content of the first polymer with respect to 100 parts by mass of the compound is no less than 0.1 parts by mass and no greater than 200 parts by mass, (1)

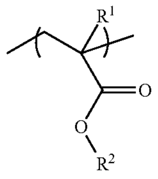

wherein, in the formula (1), $R^1$ represents a hydrogen atom or a substituted or unsubstituted monovalent hydrocarbon group having 1 to 20 carbon atoms; and $R^2$ represents a monovalent hydrocarbon group having 1 to 20 carbon atoms, a part or all hydrogen atoms of the monovalent hydrocarbon group being substituted with a fluorine atom, and (2)

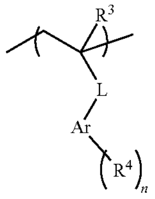

in the formula (2), $R^3$ represents a hydrogen atom or a substituted or unsubstituted monovalent hydrocarbon group having 1 to 20 carbon atoms; L represents a single bond or a divalent linking group; Ar represents a group obtained by removing (n+1) hydrogen atoms from a substituted or unsubstituted aromatic ring having 6 to 20 ring atoms; $R^4$ represents a monovalent hydroxyalkyl group having 1 to 10 carbon atoms; and n is an integer of 1 to 8, wherein in a case in which n is no less than 2, a plurality of $R^4$s are identical or different.

2. The composition according to claim 1, wherein a molecular weight of the compound is no less than 300.

3. The composition according to claim 1, wherein the compound is a second polymer comprising a structural unit comprising an aromatic ring.

4. The composition according to claim 3, wherein the second polymer is a novolac resin, a resol resin, an acenaphthylene resin, an indene resin, an arylene resin, a triazene resin, or a calixarene resin.

5. The composition according to claim 1, wherein the hydroxyalkyl group in $R^4$ is a monohydroxyalkyl group.

6. The composition according to claim 5, wherein the monohydroxyalkyl group is a monohydroxymethyl group.

7. The composition according to claim 1, wherein a proportion of the first structural unit with respect to total structural units constituting the first polymer is no less than 10 mol % and no greater than 90 mol %.

8. The composition according to claim 1, wherein a proportion of the second structural unit with respect to total structural units constituting the first polymer is no less than 10 mol % and no greater than 90 mol %.

9. The composition according to claim 1, wherein a content of the first polymer with respect to 100 parts by mass of the compound is no less than 1 part by mass and no greater than 15 parts by mass.

10. A method of forming a resist underlayer film, the method comprising:

applying a composition for resist underlayer film formation directly or indirectly on a substrate to form the resist underlayer film, wherein the composition for resist underlayer film formation comprises:

a compound comprising an aromatic ring; and a first polymer comprising a first structural unit represented by formula (1) and a second structural unit represented by formula (2), wherein a content of the first polymer with respect to 100 parts by mass of the compound is no less than 0.1 parts by mass and no greater than 200 parts by mass, (1)

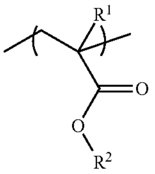

wherein, in the formula (1), $R^1$ represents a hydrogen atom or a substituted or unsubstituted monovalent hydrocarbon group having 1 to 20 carbon atoms; and $R^2$ represents a monovalent hydrocarbon group having 1 to 20 carbon atoms, a part or all hydrogen atoms of the monovalent hydrocarbon group being substituted with a fluorine atom, and (2)

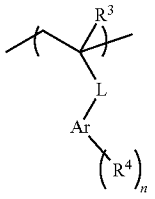

in the formula (2), $R^3$ represents a hydrogen atom or a substituted or unsubstituted monovalent hydrocarbon group having 1 to 20 carbon atoms; L represents a single bond or a divalent linking group; Ar represents a group obtained by removing (n+1) hydrogen atoms from a substituted or unsubstituted aromatic ring having 6 to 20 ring atoms; $R^4$ represents a monovalent hydroxyalkyl group having 1 to 10 carbon atoms; and n is an integer of 1 to 8, wherein in a case in which n is no less than 2, a plurality of $R^4$s are identical or different.

11. A method of forming a resist pattern, the method comprising:

applying a composition for resist underlayer film formation directly or indirectly on a substrate to form a resist underlayer film;

applying a composition for resist film formation directly or indirectly on the resist underlayer film to form a resist film;

exposing the resist film to a radioactive ray; and developing the resist film exposed, wherein the composition for resist underlayer film formation comprises:

a compound comprising an aromatic ring; and a first polymer comprising a first structural unit represented by formula (1) and a second structural unit represented by formula (2), wherein a content of the first polymer with respect to 100 parts by mass of the compound is no less than 0.1 parts by mass and no greater than 200 parts by mass,

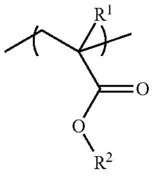

(1)

wherein, in the formula (1), $R^1$ represents a hydrogen atom or a substituted or unsubstituted monovalent hydrocarbon group having 1 to 20 carbon atoms; and $R^2$ represents a monovalent hydrocarbon group having 1 to 20 carbon atoms, a part or all hydrogen atoms of the monovalent hydrocarbon group being substituted with a fluorine atom, and

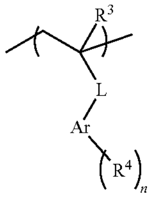

(2)

in the formula (2), $R^3$ represents a hydrogen atom or a substituted or unsubstituted monovalent hydrocarbon group having 1 to 20 carbon atoms; L represents a single bond or a divalent linking group; Ar represents a group obtained by removing (n+1) hydrogen atoms from a substituted or unsubstituted aromatic ring having 6 to 20 ring atoms; $R^4$ represents a monovalent hydroxyalkyl group having 1 to 10 carbon atoms; and n is an integer of 1 to 8, wherein in a case in which n is no less than 2, a plurality of $R^4$s are identical or different.

12. The method according to claim 11, further comprising, before the applying of the composition for resist film formation, forming a silicon-containing film directly or indirectly on the resist underlayer film.

* * * * *